United States Patent
Martin et al.

(10) Patent No.: US 7,365,580 B2
(45) Date of Patent: Apr. 29, 2008

(54) SYSTEM AND METHOD FOR JITTER CONTROL

(75) Inventors: Kenneth William Martin, Toronto (CA); David J. Cassan, Toronto (CA)

(73) Assignee: Snowbush Inc., Toronto (CA)

( * ) Notice: Subject to any disclaimer, the term of this patent is extended or adjusted under 35 U.S.C. 154(b) by 0 days.

(21) Appl. No.: 11/239,200

(22) Filed: Sep. 30, 2005

(65) Prior Publication Data

US 2006/0164132 A1 Jul. 27, 2006

Related U.S. Application Data

(60) Provisional application No. 60/644,994, filed on Jan. 21, 2005.

(51) Int. Cl.
*H03L 7/06* (2006.01)
(52) U.S. Cl. ........................ 327/156; 327/147
(58) Field of Classification Search ........ 327/147–149, 327/156–158
See application file for complete search history.

(56) References Cited

U.S. PATENT DOCUMENTS

| | | | | |
|---|---|---|---|---|
| 4,965,531 A | * | 10/1990 | Riley | ............ 331/1 A |
| 6,008,703 A | * | 12/1999 | Perrott et al. | ............ 332/100 |
| 6,703,878 B2 | * | 3/2004 | Soumyanath et al. | ....... 327/157 |
| 6,708,026 B1 | * | 3/2004 | Klemmer et al. | ........... 455/314 |

* cited by examiner

*Primary Examiner*—Dinh T. Le
(74) *Attorney, Agent, or Firm*—Torys, LLP

(57) ABSTRACT

A fractional-N frequency synthesizer is described that includes a voltage controlled oscillator (VCO), a programmable integer divider, and a glitch-free phase rotator. The phase select inputs of the phase rotator are controlled by a delta-sigma modulator to provide fine frequency resolution in addition to randomization and noise shaping of fractional quantization noise. The delta-sigma modulator is clocked at rates higher than the synthesizer reference clock resulting in an improvement in clock jitter at the output of the frequency synthesizer. A glitch-free phase multiplexer design is used to implement the phase rotator fractional divider to enables operation at rates higher than the reference clock. The over-sampling ratio of the delta-sigma modulator over the reference clock frequency of the PLL translates directly into an improvement in the quality of the output clock with respect to fractional quantization noise, phase mismatch, and digital noise injection.

56 Claims, 9 Drawing Sheets

SYSTEM AND METHOD FOR JITTER CONTROL

PRIORITY CLAIM

The present application claims priority from provisional U.S. Patent Application No. 60/644,994, titled "SYSTEM AND METHOD FOR JITTER CONTROL", filed on Jan. 21, 2005, the contents of which are incorporated herein by reference.

FIELD OF INVENTION

The present invention relates generally to microelectronic circuits and more particularly to a frequency synthesizer.

BACKGROUND OF THE INVENTION

Presently, many electronic systems use the function of clock generation and multiplication. Examples include, yet are not limited to, a graphics digitizer for flat panel displays and LCD computer monitors, and the analog read channel integrated circuit of a hard disk drive. Clock generators, typically known as frequency synthesizers, also find use in wireless applications where they are used to generate local oscillators in transmitters and receivers with fine channel spacing and often times modulation applied to the carrier signal. Frequency synthesizers are also commonly used to generate a clock to establish the time to sample a data signal.

Traditionally, frequency synthesizers are classified into two distinct categories: fractional-N synthesizers which generate an output clock that is a non-integer multiple of the input clock and integer-N synthesizers which generate an output clock that is an integer multiple of the input clock. Fractional-N synthesis offers an advantage over integer-N based synthesis since it allows a finer frequency resolution than the reference or input frequency, as described, for example, in U.S. Pat. No. 3,928,813, Issue Date: Dec. 23, 1975, "Device for synthesizing frequencies which are rational multiples of a fundamental frequency". However, there is a tradeoff for the improvement in the frequency resolution. Prior art fractional-N synthesizers have an inherent performance limitation due to the use of a fractional (i.e. non-integer) multiplication factor between the output clock and input clock. This performance limitation exists in addition to all other error terms found in classical integer-N clock generators/multipliers. In particular, the actual clock edges show a deviation from the timing of an ideal periodic clock signal, a phenomenon commonly referred to as clock jitter. Jitter reduces the timing precision and, hence, signal quality. Moreover, since the output clock of a frequency synthesizer is often sent to many components in a system, any jitter present in the frequency synthesizer's output clock can propagate throughout the multiple components resulting in a degradation of performance, and possibly even failure, across larger systems.

The reduced system performance that can result from the use of fractional-N synthesizers can limit the usability of such synthesizers. For example, according to digital communication standards, such as Serial ATA as described in High Speed Serialized AT Attachment, Serial ATA Working Group, Revision 1.0a, Jan. 7, 2003, PCI Express as described by PHY Interface for the PCI Express Architecture, Intel Corporation, Version 0.95, Apr. 25, 2003, and Fiber Channel as described by Fiber Channel Physical Interfaces: FC-P1-2, American National Standard for Information Technology, Revision 4.0, July, 2003. An incoming data stream is sampled into a sequence of ones and zeros to extract the information contained in the incoming data. To achieve optimum performance, the clock used to sample the input data is positioned in the center of the data bit. The system performance of such systems is typically measured in terms of bit error rate ("BER") where BER is the probability of having a bit error. If the jitter present on the sampling clock is greater than half a data-bit period in either direction from the optimal sampling time, then a bit error can occur. Since the additional jitter introduced by a fractional synthesizer can significantly degrade BER, fractional synthesizers are traditionally not used in data sampling applications.

Data sampling is not the only area of application where usability of fractional synthesizers is limited due to jitter. Similar limitations of use exist in other areas. For example, increased jitter associated with fractional frequency synthesizers can limit the maximum resolution at which a clear picture can be viewed on a flat panel display or LCD computer monitor. Increased jitter can also reduce the signal-to-noise ratio for a hard disk drive read path limiting maximum data density and speed.

As a result of usability limitations, numerous attempts have been made at constructing reduced jitter fractional synthesizers. Before discussing these attempts, it is useful to review the basics of frequency synthesizers. Typically, a frequency synthesizer can be implemented using a charge pump phase locked loop (PLL). The general structure of a prior art PLL consists of a phase and frequency detector (PFD), a charge pump (CP), a proportional and integral path loop filter (LF), a voltage-controlled oscillator (VCO), and a divider in the feedback path as described in 'Phase Locked Loops' by R. E. Best, McGraw-Hill, 1993. PLLs often contain additional dividers in the reference path before the PFD and after the VCO outside of the feedback loop to allow greater control over output clock frequency.

The PFD generates an output signal that is proportional to both the frequency and phase difference between its two inputs: the reference input and the output of the feedback divider. The charge pump and loop filter transform this signal into a voltage waveform while providing low-pass filtering. The poles and zeroes of the loop filter as well as the charge pump current and VCO gain determine the characteristics and phase transfer function of the PLL. The output voltage of the loop filter controls the frequency of the VCO. The VCO generates the output clock of interest that is sent to the feedback divider as well as out of the PLL; optionally through a post-divider in the output path.

The feedback divider divides the VCO clock down to the frequency of the reference clock. Since the PLL is a negative feedback system in a closed-loop configuration, the PLL will eventually settle to the operating point where the reference clock and output clock of the feedback divider are phase and frequency locked. In this condition, the frequency ratio between the output clock and the reference clock is determined solely by the division factor in the feedback path between the VCO and the PFD. An integer divider provides an integer-N frequency synthesizer, whereas a fractional divider will provide a Fractional-N frequency synthesizer.

There are two popular methods to accomplish a fractional divider in the feedback path. The first method uses a dual-modulus divider to switch between two integer divide values as described in U.S. Pat. No. 3,928,813, Issue Date: Dec. 23, 1975, "Device for synthesizing frequencies which are rational multiples of a fundamental frequency", and U.S. Pat. No. 3,976,945, Issue Date: Aug. 24, 1976, "Frequency synthesizer". The fractional division value is then determined by the average divide value, that lies somewhere between the two integer divide values and is determined by the duty-cycle of the dual-modulus divider. A disadvantage of this method is that it can produce unwanted spectral components at the VCO output called fractional spurs. These fractional spurs lead to increased jitter at the output clock of the PLL. The frequency offset of the fractional spur is determined by the duty cycle of the dual modulus divider and can occur at relatively low frequencies relative to the PLL loop bandwidth. Since the PLL acts like a low-pass filter with respect to jitter sources at the inputs to the PFD, low-frequency fractional spurs that fall below the PLL loop bandwidth will contribute directly to output clock jitter.

The second method uses a multi-phase fractional divider in the feedback path of the PLL as described in J. Craninckx, M. Steyaert, IEEE Journal of Solid State Circuits, "A 1.75-GHz/3-V Dual-Modulus Divide-by-128/129 Prescaler in 0.7 um CMOS", July, 1996, and U.S. Pat. No. 5,970,110, Issue Date: Oct. 19, 1999, "Precise, Low-Jitter Fractional Divider using Counter of Rotating Clock Phases". This method uses multiple phases at either the VCO frequency or a divided down VCO frequency to equally span one full clock period. The fractional divider then performs phase interpolation or phase selection between these multiple phases to accomplish fractional divide values. This method allows finer frequency resolution and smaller phase quantization error than a dual-modulus divider. The use of multiple phases is often not a problem since it also allows for multiple output clock phases that are often used in a given application. The method, however, still suffers from fractional spurs at a frequency offset determined by the desired fractional division value. This method also suffers from the additional error term introduced by phase mismatch between the multiple phases of the VCO or delay paths within the VCO buffers or multi-phase divider. Such dividers are also not able to divide by an arbitrary fraction M. N where M is the integer part and N is the fractional part of a real number.

An improvement to fractional synthesizers can be attained by adding a delta-sigma modulator ("DSM") to control the feedback fractional divider. This was originally reported in B. Miller, B. Conley, IEEE 44th Annual Symposium on Frequency Control, "A Multiple Modulator Fractional Divider", May, 1990, T. Riley, M. Copeland, Source: IEEE Journal of Solid State Circuits, "Delta-Sigma Modulation in Fractional-N Frequency Synthesis", May, 1993, and U.S. Pat. No. 4,965,531, Issue Date: Oct. 23, 1990, "Frequency synthesizers having dividing ratio controlled by sigma-delta modulator". A delta-sigma modulator produces a quantized (one to several bits) output from a high resolution input with the error resulting from this quantization spectrally shaped to reduce its spectral density at frequencies approaching direct current or zero frequency ("DC") and multiples of the DSM clock frequency. This randomization and spectral noise shaping applies to the quantization noise inherent in fractional dividers, thereby reducing the quantization noise level within the passband of the PLL. This allows a significant portion of the quantization noise to be removed by the loop filter of the PLL, leading to an improved output clock jitter. Another advantage of using a delta-sigma fractional synthesizer is that the synthesizer resolution (i.e., frequency step size) can be made arbitrarily small by adding more bits to the delta-sigma modulator.

A disadvantage of fractional synthesizers based on DSMs is that the time quantization step size of the delta-sigma modulator is one reference clock VCO period. That is, because the DSM is used to control a dual modulus N/N+1 type fractional divider, the divider can only change by integer amounts. This limits the step size for the DSM to one reference cycle. Also, the clock rate of the DSM is limited to the reference clock rate since this is the update rate of the dual modulus divider. Therefore, the quantization noise spectrum is whitened up to half the frequency of the reference input, with a large proportion of its energy still falling within the passband of the PLL.

High-order DSMs have been utilized to remove the quantization error introduced by fractional synthesizers based on DSMs. However, since the power dissipation and chip area used for a DSM scales directly with its respective order, use of this technique requires a tradeoff between the amount of fractional quantization error suppression and increased overall power consumption and size. An additional disadvantage of a high order DSM is that the PLL loop filter is typically of the same or greater order than the DSM to adequately suppress the out-of-band quantization noise. Designing PLLs with loop filters greater than second order becomes extremely difficult due to stability limitations in this negative feedback system. Because of these limitations, fractional synthesizers employing delta-sigma modulators typically use only second or third order delta-sigma modulators, limiting the practical improvement of using delta-sigma modulation to reduce the fractional quantization noise and hence jitter.

The earliest attempt to combine the use of a multi-phase feedback divider and delta-sigma modulation was previous research of Dr. Ken Martin, inventor of the present invention, and one of his Master's students and was reported in Wynstan Ka-Wai Tong supervised by Ken Martin, Master's Thesis at the University of Toronto, "A GHz CMOS Frequency Synthesizer for Mobile Communications", Master's Thesis at the University of Toronto, July 1997. In the reported work (and as is found in other prior art) the delta sigma modulator is clocked at the reference clock rate of the PLL. Tong, thus, does not solve the problem of constructing a jitter reduced frequency synthesizer combining a multi-phase feedback divider with high speed delta-sigma modulation.

An alternative method of implementing a multi-phase fractional divider is reported in C. H. Park, O. Kim, B. Kim, IEEE Journal of Solid State Circuits, "A 1.8 GHz Self-Calibrated Phase-Locked Loop with Precise I/Q Matching", April, 2003. This approach allows operation of the fractional divider at higher clock frequencies since the feedback divider consists of a single phase integer divider that is followed by a phase select multiplexer to realize the fractional division control. The output of the integer divider at the reference clock frequency (fref) is sampled with the higher-speed VCO to get the phase resolution of the VCO at the update rate of the reference input and sent into a phase select multiplexer. This allows simpler implementation of the phase select multiplexer since it only operates at the reference clock rate and therefore allows for operation at higher VCO rates. An accumulator is used to control the feedback division ratio with the input to the modulo-Np (where Np=number of phases used) accumulator representing the fractional divider value and the carry out of the accumulator used to add or subtract one VCO cycle from the integer divider. This type of fractional feedback divider has the purported advantage that ideally it introduces no fractional quantization error, although its frequency resolution is limited to the reference frequency divided by the number of phases used (i.e., fref/Np). It was also found that this class of fractional divider is very susceptible to phase mismatch errors leading to fractional spurs and a corresponding degradation in output clock jitter performance. A further limitation of this class of fractional divider is that the update rate is limited to the reference clock frequency of the PLL since this is the clock rate at the output of the integer divider.

A recent improvement to this type of fractional divider is to add delta-sigma modulation to whiten and spectrally shape the delay error produced by the phase mismatch as described in T. Riley, J. Kostamovaara, IEEE Transactions on Circuits and Systems II, "A Hybrid Delta-Sigma Fractional-N Frequency Synthesizer", April, 2003. The delta-sigma modulator randomizes and spectrally shapes the delay error introduced by the phase mismatch, resulting in an improvement in output clock jitter. Since multiple phases are used with delta-sigma modulation this reduces the quantization step size by an amount equal to the number of phases.

Although the fractional divider in this case is a multi-phase fractional divider, the update rate of the phase select multiplexer is at the reference rate limiting the maximum clock frequency of the delta-sigma modulator to the reference clock frequency. Another disadvantage of this approach is that a high-order modulator is used to reduce the phase mismatch error to negligible levels. In the reported work, for example, a seventh order modulator is used. This high an order of delta-sigma modulator introduces significant complexity that increases power and area consumption in implementation. Moreover, a high-order delta-sigma modulator also uses either a higher-order loop filter in the PLL or a lower PLL loop bandwidth to suppress the larger peak quantization noise inherent in using a high-order modulator. Thus, a fractional synthesizer with a delta-sigma modulator of order greater than three is generally not used and this limits the practical usefulness of this approach.

Another alternative to reducing phase quantization noise in a frequency synthesizer can be implemented using a dual-modulus fractional divider followed by compensation within the loop filter of the PLL to cancel the quantization noise (S. E. Meninger, M. H. Perrot, IEEE Transactions on Circuits and Systems II, "A Fractional-N Frequency Synthesizer Architecture Utilizing a Mismatch Compensated PFD/DAC Structure for Reduced Quantization-Induced Phase Noise", November, 2003). This method has been used with an accumulator, as opposed to a delta-sigma modulator, to control the fractional divider because in this case the quantization error is more predictable. The accumulator output is also sent to a digital-to-analog converter (DAC) to cancel the fractional quantization noise in the loop filter of the PLL. This approach is limited by analog matching precision that results in incomplete phase-error signal cancellation and spurious feed-though.

Another source of jitter in multi-phase or phase switching fractional dividers are glitches which can also cause the frequency synthesizer to fall out of phase lock (see J. Craninckx, M. Steyaert, IEEE Journal of Solid State Circuits, "A 1.75-GHz/3-V Dual-Modulus Divide-by-128/129 Prescaler in 0.7 um CMOS", July, 1996 ("Craninckx and Staeyart"), N. Krishnapura and P. Kinget IEEE Journal of Solid State Circuits, "A 5.3-GHz programmable divider for HiperLAN in 0.25 um CMOS", July 2000 ("Krishnapura"), M. Perrot Ph.D. dissertation "Techniques for high data rate modulation and low power operation of fractional-N frequency synthesizers" Massachusetts Institute of Technology, September 1997 ("Perrot"), A. Benachour, S. Embadi, and A. Ali proceedings of the IEEE Custom Integrated Circuits Conference "A 1.5 GHz sub-2 mW CMOS dual modulus prescaler" May 1999 ("Benachour"), and Keliu Shu Pd.D. dissertation "Design of a 2.4 GHz CMOS monolithic fractional-N frequency synthesizer" Texas A&M University, May 2003 ("Shu")).

Attempts have been made to eliminate such glitches. However, these attempts have their disadvantages and do not allow robust operation of a phase switching fractional divider at high clock rates without imposing limitations. For example, the system as disclosed by Krishnapura is sensitive to process variation and thus not suitable for large scale production. In Perrot, feedback from the phase select multiplexer is used. However, Perrot's approach reduces the maximum operating speed. A synchronizing flip-flop is used in Benachour to retime the phase select multiplexer control signal. In addition to the technique described above, Krishnapura also uses a retiming circuit in a attempt to reduce glitches. However, using such synchronization or retiming does not render the phase-switching operation any more robust because it can be difficult to implement in a high-speed circuit and the timing requirements of this circuit are very stringent. Moreover, Krishnapura's multi-faceted approach introduces more complexity that increases power consumption and size in implementation.

According to the disclosure in Shu, phase switching occurs in only one direction. By designing a phase rotator to only pick a previous phase, a glitch can be avoided since a glitch can only occur when the phase rotator rotates to the next phase, provided that all other timing requirements are met. Thus, Shu does not remove glitches but attempts to avoid a condition under which a glitch can occur. Specifically, Shu's disclosure does not contain an explicit circuit to remove glitches. Moreover, since Shu's disclosure restricts phase shifts to only one direction, the fractional tuning range is cut in half.

SUMMARY OF THE INVENTION

It is an object of the present invention to provide a novel system and method for jitter control that obviates or mitigates at least one of the above-identified disadvantages of the prior art.

According to an aspect of the invention, there is provided a device for synthesizing a frequency comprising a forward portion having a reference input for receiving a reference clock signal and a feedback input for receiving a feedback signal. The forward portion has a forward portion output and is operable to generate an oscillating signal based on a phase or a frequency or a phase and frequency difference between the reference and feedback inputs. The oscillating signal is deliverable from the forward portion output.

The device also comprises a delta-sigma modulator (DSM) having a DSM clock input for receiving a first driving clock signal. The DSM has a DSM input for receiving a high resolution input signal. The first driving clock signal has a frequency greater than the reference clock signal. The DSM also has a DSM output. The DSM is operable to generate a quantized bit-stream signal from the high resolution input signal that is delivered from the DSM output.

The device further comprises a fractional divider having a fractional divider input connected to the forward portion output for receiving the oscillating signal. The fractional divider has a control input connected to the DSM output for receiving the bit-stream signal. The fractional divider has a fractional divider driving clock input for receiving a second driving clock signal. The fractional divider has a fractional divider output for delivering a fractionally divided signal. The fractional divider is operable, according to the bit-stream signal, to generate the fractionally divided signal having a frequency that is a fraction of the oscillating signal's frequency.

The device also comprises a feedback integer divider (FID) having a first FID input for receiving a representation of an integer value. The FID has a second FID input connected to the fractional divider output for receiving the fractionally divided signal. The FID further has an FID output connected to the feedback input. The FID is operable to frequency divide the fractionally divided signal by the integer value in order to generate the feedback signal.

Another aspect of the invention provides a de-glitcher device comprising a first complement generator having a first complement input for receiving a glitched signal at a first phase. The first complement generator has a first complement output for delivering a complemented glitch signal that is a complement of the glitched signal.

The de-glitcher device further comprises a second complement generator having a second complement input for receiving a suppressor signal substantially identical to, and phase delayed by a delay period from, the glitched signal. The second complement generator has a second complement output for delivering a complemented supressor signal that is a complement of the suppressor signal;

The de-glitcher device also comprises a first gate having a first input for receiving the glitched signal. The first gate has a second input that is connected to the second complement output for receiving the complemented supressor signal. The first gate has a first output for delivering a reset signal;

The de-glitcher device also comprises a second gate having a third input for receiving the suppressor signal. The second gate has a fourth input that is connected to the first complement output for receiving the complemented glitched signal. The second gate has a second output for delivering a set signal.

The de-glitcher device also comprises an RS Latch having a set input connected to the second output for receiving the set signal. The RS Latch has a reset input connected to the first output for receiving said reset signal. The RS Latch has an RS Latch output for delivering a substantially glitch free signal. The RS Latch is operable to inhibit the propagation of reverse transitions in the glitched signal for the delay period before and after a transition of the glitched signal.

Another aspect of the invention provided a frequency synthesizer for generating an output signal at a first frequency from a reference signal at a second frequency, the first frequency being a real number multiple of the second frequency. The synthesizer comprises a forward portion having a first input for receiving the reference signal. The forward portion has a second input for receiving a feedback signal. The forward portion has a first output for delivering the output signal. The forward portion is operable to generate the output signal based on a cooperation of the reference signal and the feedback signal;

The synthesizer also comprises a feedback portion having a third input for receiving the output signal from the first output. The feedback portion has a feedback output for delivering the feedback signal to the second input. The feedback portion for generating the feedback signal is based on a frequency division of the output signal.

The feedback portion includes a delta sigma modulator (DSM) for controlling the frequency division. The DSM has a fourth input for receiving a clock signal which has a frequency higher than the second frequency of the reference signal. The DSM has a DSM input for receiving a DSM control signal.

Another aspect of the invention provides for a method for reducing jitter in an output clock signal of a loop based fractional synthesizer having a reference clock input, a forward portion, a phase rotator frequency divider (PRFD), a delta-sigma modulator, an integer divider, and an oscillating signal generated by said forward portion. The method comprises the steps of comprising the steps of:

generating a quantized signal by over-sampling the delta-sigma modulator at frequencies higher than the reference clock such that quantization noise contained in the quantized signal is a high frequency quantization noise;

receiving the quantized signal at the PRFD;

frequency dividing the oscillating signal by the PRFD according to the quantized signal; and filtering the high frequency quantization noise by the forward portion.

Another aspect of the invention provides for a method for synthesizing a frequency. The method comprises the steps of:

generating an oscillating signal based on a phase or a frequency or a phase and frequency difference between a reference clock signal and a feedback signal;

generating a quantized bit-stream signal based on a high resolution input signal;

generating a fractionally divided signal based on the oscillating signal according to the quantized bit-stream signal. The fractionally divided signal has a frequency that is a fraction of the oscillating signal's frequency; and generating the feedback signal by frequency dividing the fractionally divided signal by an integer value.

Another aspect of the invention provides for a method for suppressing glitch the method comprises the steps of:

generating a rotated signal based on a plurality of rotations between phases of a plurality of phase-shifted signals; and generating a substantially glitch-free signal based on an inhibition of reverse transitions for a period around a transition of the rotated signal.

BRIEF DESCRIPTION OF FIGURES

The invention will now be described by way of example only, and with reference to the accompanying drawings, in which.

DISCLOSURE

Figure 1:
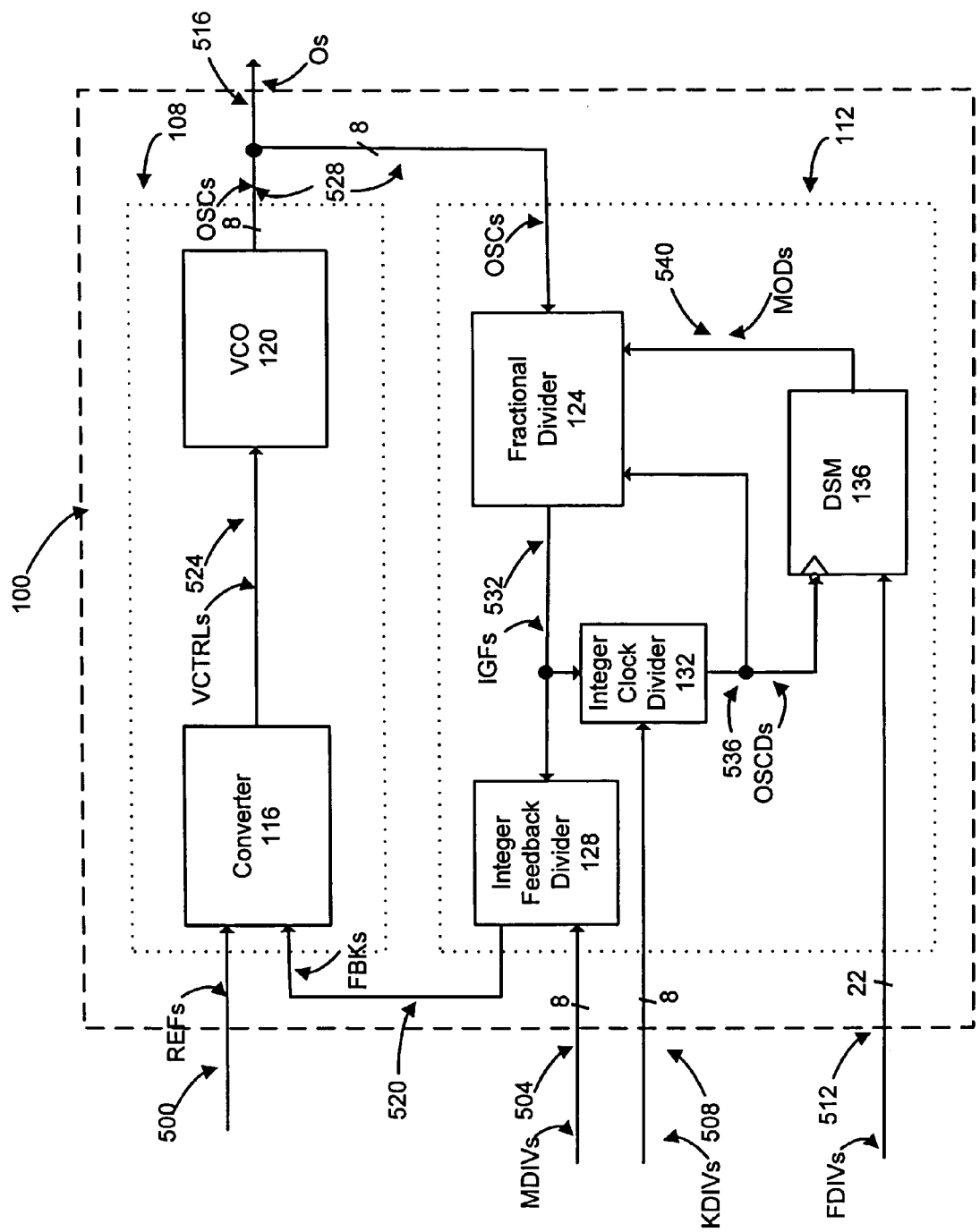
FIG. 1 is a block diagram of a frequency synthesizer in accordance with an embodiment of the invention.

Referring now to FIG. 1, a frequency synthesizer in accordance with an embodiment of the present invention is indicated generally at 100. Synthesizer 100 is operable to receive, as an input, reference clock signal REFs through data line 500. In this embodiment reference clock signal REFs takes the form of a signal generated by a crystal as described in E. A. Vittoz, M. G. R. Degruawe, and S. Bitz IEEE Journal of Solid State Circuits "High-Performance Crystal Oscillator Circuits: Theory and Application", June 1988. In other embodiments different clock signals could be used and such embodiments are within the scope of the invention. Also in this embodiment, line 500 is a data path carrying a signal, REFs, which comprises only one bit, or digit of value.

Synthesizer 100 is also operable to receive, as input, two control signals MDIVs and KDIVs. As discussed in greater detail below, signals MDIVs and KDIVs are used by integer feedback divider 128 and integer clock divider 132 both of which are, in this embodiment, components of synthesizer 100. In a present embodiment, each signal MDIVs and KDIVs is an eight bit static binary byte. Accordingly, in this embodiment, buses 504 and 508, which transmit signals MDIVs and KDIVs, each carry eight bits. In this description, busses refer to data paths that are capable of carrying signals comprising multiple bits or multiple signals. Moreover, a bus is indicated in figures with a slash drawn across it, and the number of bits or signals a bus can carry is denoted by a number proximal to the slash drawn across that bus. For example, in FIG. 1, a number "8" appears proximal to the slashes drawn across busses 504 and 508 denoting that busses 504 and 508 each carry a signal comprising eight bits. In a present embodiment, a bus is implemented as parallel data lines, each line carrying a single bit or signal comprising the multi-bit or multi-signal signal. As will be apparent to those skilled in the art, in other embodiments, busses can be implemented in other manners such as each bit being carried through a single line serially, one bit at a time. These and other embodiments involving different implementation of busses for carrying signals comprising multiple bits or digits of value are within the scope of the invention.

It should now be apparent to those skilled in the art that in other embodiments, the specifics of control signals MDIVs and KDIVs can vary. For example, in different embodiments, signals MDIVs and KDIVs can comprise of different number of bits and busses 504 and 508 can be adapted so that they can carry the number of bits composing each signal. Also, although static in this embodiment, in other embodiments values represented by signals MDIVs and KDIVs can also vary over time. These and other variations are all within the scope of the invention.

Another input signal that can be received by synthesizer 100 is a control signal FDIVs, provided through bus 512. As discussed in greater detail below, FDIVs is the input signal to a delta sigma modulator 136 ("DSM") that is a component of synthesizer 100. In a present embodiment, signal FDIVs is a twenty-two bit static binary word. Accordingly, bus 512 is operable to carry a twenty-two bit signal. It should now be apparent to those skilled in the art that in other embodiments, the specifics of control signal FDIVs can vary. For example, FDIVs can comprise of any number of bits according to the number of bits allotted to bus 512. Also, although static in this embodiment, in other embodiments values represented by FDIVs can also vary over time. These and other variations are all within the scope of the invention.

Synthesizer 100 is thus operable to generate a substantially stable multiplied frequency output in the form of an output signal Os, which is delivered through line 516. Synthesizer 100 comprises a negative feedback system in a closed-loop configuration, operable to eventually settle to the operating point where the frequency ratio between reference signal REFs and output signal Os is determined by Equation 1.

$$f_{Os} = f_{REFs} X \qquad \text{(Equation 1)}$$

In Equation 1, $f_{Os}$ is the frequency of the output signal Os, $f_{REFs}$ is the frequency of the reference signal REFs, and X is a fractional multiplication factor. Specifically, X is a real number of the form A.B where A is the integer portion of X, and B is the fractional portion of X. The resolution of synthesizer 100, (namely the minimum frequency step size) is defined by the resolution of X. In a present embodiment, the resolution of X is defined by a number of factors including the number of digits in Fdiv.

In a present embodiment, factor X is determined by Equation 2:

$$X = (Mdiv)\left(1 + \frac{Fdiv}{N_p * Kdiv}\right) \qquad \text{(Equation 2)}$$

In Equation 2, $N_p$ is the number of phases voltage controlled oscillator (VCO) 120, described below in greater detail, generates. Mdiv is the value of signal MDIVs, Kdiv is the value carried by signal KDIVs, and Fdiv is the value carried by signal FDIVs.

Synthesizer 100 includes a loop with a forward portion 108 and a feedback portion 112. In a present embodiment, forward portion 108 contains the components of the forward path of a typical phased locked loop (PLL) as described, generally in many publications known to those skilled in the art: see for example, in 'Phase Locked Loops' by R. E. Best, McGraw-Hill, 1993. Those of skill in the art will thus recognize the components in and signals generated by forward portion 108, which, in this embodiment, includes the components converter 116 and voltage controlled oscillator (VCO) 120 as well as signals VCTRL and OSCs. Thus, forward portion 108 is operable to take a reference signal, in this embodiment signal REFs, supplied through line 500, and a feedback signal, in this embodiment signal FBKs, generated by the feedback portion 112, and produce signal OSCs, which is the output signal Os, as well as the input signal to feedback portion 112.

Converter 116 includes analog phased locked loop components that are known to those skilled in the art. For example, the combination of a PFD, charge pump, and loop filter is a commonly used for implementing Converter 116. Converter 116 is, thus, operable to deliver its output, signal VCTRLs to VCO 120 through line 524.

Continuing with the description of forward portion 108, in this embodiment VCO 120 takes the form of a low noise oscillator as described in 'The Design of Low Noise Oscillators', by A. Hajimiri, T. H. Lee, Kluwer Academic, 1999). In other embodiments other architectures can be used to implement VCO 120. VCO 120 is operable to generate a multi-phased oscillating signal OSCs based on the driving signal VCTRLs received via line 524. In a present embodiment VCO 120 outputs a signal OSCs through bus 528. Signal OSCs comprises eight phase signals, signal $OSCs_0$ through signal $OSCs_7$, each at a fixed phase and frequency relationship to the reference signal REFs. The eight phase signals of OSCs are equally spaced across one period of signal OSCs, each phase signal separated by one-eighth of an OSCs period. Accordingly, bus 528 is capable of carrying the eight phase signals of OSCs. In other embodiments, the number of phases outputted can vary according to the number of signals bus 528 can carry. Presently preferred values include four, six eight or ten and all these embodiments are within the scope of the invention.

Figure 2:
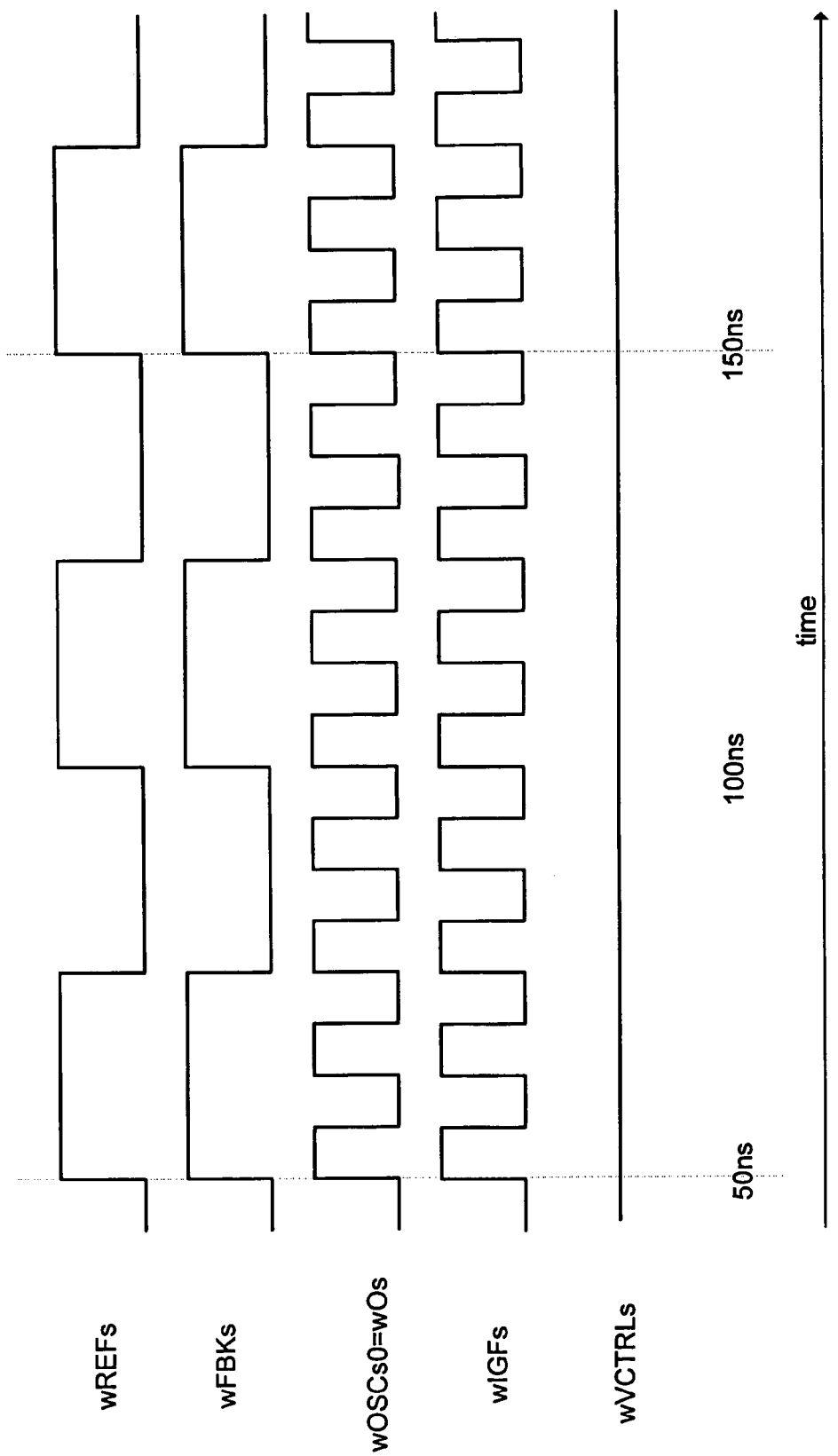
FIG. 2 is an exemplary set of waveforms for use in frequency synthesizer of FIG. 1.

Continuing with the description of forward portion 108, the operation of forward portion 108 will now be discussed in greater detail. FIG. 2 shows example waveforms wREFs, wFBKs, wVCTRLs corresponding to reference signal REFs at line 500, feedback signal FBKs at path 520, and voltage controller signal VCTRLs at line 524. It should be noted that the exemplary waveforms shown in FIG. 2 are idealized to aid in the description of this example. The example waveforms in FIG. 2 will be discussed in relation to their travel through synthesizer 100. Thus, the following discussion of these examples should be read with reference to both FIG. 1 and FIG. 2.

Continuing with the example, converter 116 is operable to generate output signal VCTRLs in response to phase and frequency differences in its input signals REFs and FBKs. In this example, waveforms wREFs and wFBKSs are substantially phase and frequency-locked at a suitable frequency. Moreover, in the present example, the suitable frequency of waveforms wREFs and wFBKs is about twenty megahertz ("MHz") each, however other frequencies are within the scope of the invention. Accordingly, as it will be recognized by those skilled in the art, the example waveform VCTRLs generated in response to generated by converter 116 is a straight line indicating a constant control voltage as shown in FIG. 2.

Continuing with the discussion of forward portion 108's operation, converter 116 is also operable as a low pass filter, in large part determining the loop bandwidth of synthesizer 100. An appropriate choice of a loop bandwidth enables stable operation of synthesizer 100. A variety of cut-off frequencies can be used to define the loop bandwidth of synthesizer 100. In a presently preferred embodiment, cut-off frequency choices lie between one-tenth and one twentieth of the frequency of reference signal REFs. However, in other embodiments, other cut-off frequencies can also be used and such embodiments are within the scope of the invention.

Figure 3:
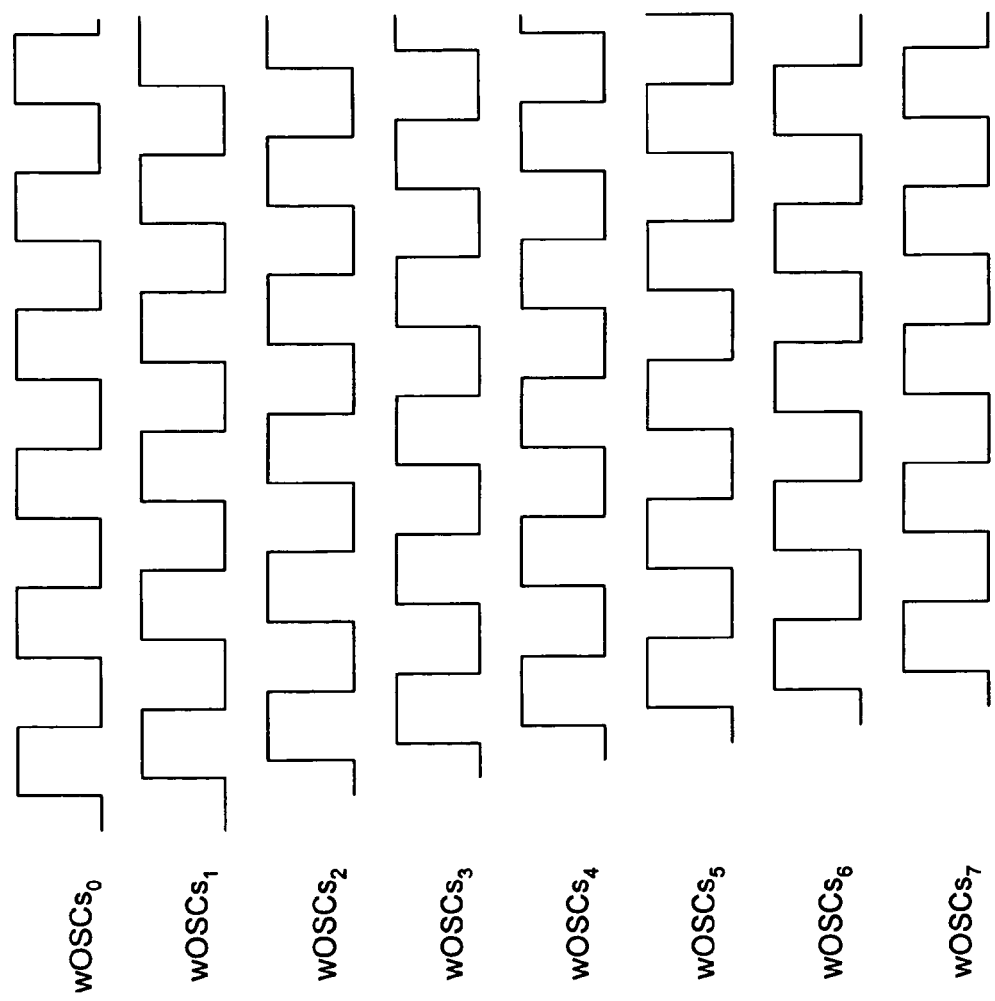
FIG. 3 is another exemplary set of waveforms for use in frequency synthesizer of FIG. 1.

As is known by those skilled in the art, properties of VCTRLs determine the phase and frequency of the output signal of VCO 120, signal OSCs. Signal OSCs is the source of the output signals Os of synthesizer 100 which is delivered via line 516. In a present embodiment, any one or all of the eight phases that compose signal OSCs can be used as the output signal Os. Continuing with the example, FIG. 3 depicts example waveforms $wOSCs_0$ through $wOSCs_7$ corresponding to the eight phases of output signal OSCs at bus 528. These signals are generated in response to waveform wVCTRLs. In addition, FIG. 2 shows waveform $wOSCs_0$, in relation to waveform wREFs. Also, in this example, it is assumed that signal $OSCs_0$ is chosen as the output signal Os. Accordingly, FIG. 2 depicts waveform $wOSCs_0$ to be the same as waveform Os. Furthermore, in this example, it is also assumed that the multiplication factor X, as defined in Equation 1, is about 4.0. Thusly, signal Os has a frequency of about 40 MHz. For simplicity of illustration, in this idealized example, a factor of 4.0 is depicted. "4.0" is intended to denote a real number with a fractional component due to the presence of the zero following the decimal point. The fact that "4.0" is chosen, which is equal to the integer "4", does not imply that this is an integer multiplier. Rather, to reiterate, "4.0" is chosen as a non-integer to simplify explanation.

Some or all phases of signals OSCs can also form the input to feedback path 112 of synthesizer 100. Feedback path 112 comprises a fractional divider 124, an integer fractional divider 128, an integer clock divider (ICD) 132, and a delta-sigma modulator (DSM) 136. Feedback path 112 is operable to generate feedback signal FBKs by fractionally dividing the frequency of its input signals OSCs, thus allowing synthesizer 100 to eventually settle at an operating point such that the output signal Os has a frequency that is a non integer multiple of the frequency of reference clock REFs.

Describing feedback path 122 in greater detail, fractional divider 124 receives an input signal of feedback path 112, signal OSCs, as its input fractional divider 124 supplies its output signal IGFs to two integer dividers, integer fractional divider 128 and integer clock divider 132 through line 532. A presently preferred implementation of fractional divider 124 will be discussed in detailed further below. (However, those of skill in the art will come to recognize that other implementations of fractional divider 124 are also within the scope of the invention). To briefly summarize, fractional divider 124 is operable to generate a glitch free frequency divided signal IGFs such that:

$$f_{IGFs} = Y \cdot f_{OSCs} \quad \text{(Equation 3)}$$

In Equation 3, $f_{IGFs}$ is the frequency signal IGFs, $f_{OSCs}$ is the frequency of the input signal OSCs, and Y is a number greater than or less than or equal to one but greater than zero. In other embodiments the frequency of signal IGFs can be greater than the frequency of signal OSCs, yet only by a fractional amount.

Referring back to FIG. 2, an example waveform corresponding to output signal of fractional divider 124 at line 532 is shown at wIGFs. As will be recognized by those skilled in the art that, although, for simplicity of illustration, in this idealized example, the frequency of waveform wIGFs is an integer fraction of the frequency of waveform wOSCs0, the frequency of signal IGFs can be a non-integer fraction of the frequency of signal $OSCs_0$.

Continuing with feedback path 112 in FIG. 1, integer dividers integer feedback divider 128 and integer clock divider 132 are operable to receive the output signal IGFs of fractional divider 124 through line 532. In a present embodiment integer clock divider 132 and integer fractional divider 128 can take the form of a low-power frequency divider as described in B. Ravazi, K F Lee, R H Yan IEEE Journal of Solid State Circuits 'The Design of high-speed, low-power frequency dividers and phase locked loops in deep submicron CMOS', 1995 (However, those of skill in the art will now recognize that other implementations of integer clock divider 132 and integer fractional divider 128 are also within the scope of the invention). Integer dividers integer fractional divider 128 and integer clock divider 132 are also operable to receive control signals MDIVs and KDIVs respectively. MDIVs and KDIVs control the operation of integer dividers integer fractional divider 128 and integer clock divider 132 by providing an integer value by which the frequency of signal IGFs is divided. Thus both integer fractional divider 128 and integer clock divider 132 are operable to output signals at frequencies that are an integer factor of the frequency of IGFs.

Continuing now with the description of integer fractional divider 128, the output of integer fractional divider 128 is connected, through line 524, to one of the inputs of converter 116; namely, the output of integer fractional divider 128 is the feedback signal FBKs discussed previously. Accordingly, the frequency of FBKs is an integer factor of the frequency of IGFs, where the integer factor is the value of input signal MDIVs.

Referring back to FIG. 2, an example waveform wFBKs corresponding to output signal of integer fractional divider 128 at line 520 is shown. As will be recognized by those skilled in the art that, although, for simplicity of illustration, in this idealized example the frequency of waveform wFBKs is an integer factor of the frequency of waveform wIGFs, in other embodiments, the frequency of signal wFBKs can be a non-integer fraction of the frequency of signal IGFs.

(It will now be apparent to those skilled in the art that many different integer values can be chosen for control signal MDIVs, causing synthesizer 100 to eventually settle at different operating points and thus, altering the frequency ratio between reference signal REFs and output signal Os. All of these variations are within the scope of the invention.)

Continuing now with the description of integer clock divider 132, the output of integer clock divider 132 is delivered through line 536, as a clock signal OSCDs, to both DSM 136 and fractional divider 124. To simplify explanation of the present example, it is assumed that KDIVs, the input signal to ICDs, is set to one, meaning that the frequency of signal OSCDs will be equal to the frequency of integer clock divider 132's input signal, which, in this example, is IGFs. Accordingly, in this example, OSCDs is substantially the same as signal IGFs. Thus, again in this example, both DSM 136, and fractional divider 124 are operated at the frequency of signal IGFs. However, as will be recognized by those skilled in the art, in other embodiments DSM 136 and fractional divider 124 can operate at frequencies that are different from each other and these embodiments are within the scope of the invention.

(It will now be apparent to those skilled in the art that many different integer values can be chosen for control signal KDIVs, resulting in different operating frequencies for DSM 136 and PRFD 128, operating frequencies that are integer divisions of the signal IGFs. For the case where KDIVs is set to a value of one, DSM 136 and fractional divider 124 are clocked at the output frequency of fractional divider 124. All of these variations are within the scope of the invention.)

Continuing with feedback path 112, DSM 136 can be constructed in any desired manner, such as in accordance with the description found in "Oversampling Delta-Sigma Data Converters: Theory, Design, and Simulation" James C. Candy, Gabor C. Temes John Wiley and Sons 1991. DSM 136, in addition to receiving a clock signal OSCDs, also receives an input signal FDIVs through bus 512. The output of DSM 136, MODs, is a dynamic signal supplied to fractional divider 124 through bus 544. Signal FDIVs is a large resolution (namely represented by a large number of bits) digital signal that defines the fractional division value of feedback path 112. For example, in this embodiment, signal FDIV is a twenty two bit digital signal that can take on any value from zero to $2^{22}-1$. In other embodiments, signal FDIV can be both a static control signal that does not vary in time, or a dynamic control signal that varies in time at a frequency that is substantially lower than the frequency of reference signal REFs. Moreover, in yet other embodiments, signal FDIVs can have a higher or lower resolution. These and other variations of signal FDIVs are within the scope of the invention.

DSM 136 is operable to generate an output signal that is a low resolution quantized and randomized version of its high resolution input signal. In a present embodiment, DSM 136 uses input signal FDIVs to generate an output bit-stream signal MODs. Output signal MODs is a low resolution bit stream that is a quantized and randomized version of signal FDIVs. In this example, signal MODs is a two bit binary signal which can take on three discrete binary values, value of 11 representing decimal value negative one, 00 representing decimal value zero, and 01 representing decimal value one (the binary value 10 is not used). DSM 136 is operable to generate signal MODs at the frequency of its clock signal OSCDs so that the value of MODs averaged over a long period of time (for example over $2^{22}$ cycles of OSCDs) approximately equals the normalized value of the input control word FDIVs (i.e. the value of signal FDIVs divided by the maximum possible value of signal FDIVs, which in the present example is $2^{22}-1$). Thus, signal MODs contains both the information contained in signal FDIVs as well as a quantization error that is inherent in converting a large resolution input to a much lower (yet much higher frequency) output. The quantization error, when taken over a long period of time (in this example $2^{22}$ clock periods of signal OSCDS) averages to zero such that the average value of signal MODs equals normalized value of signal FDIVs.

Figure 4:
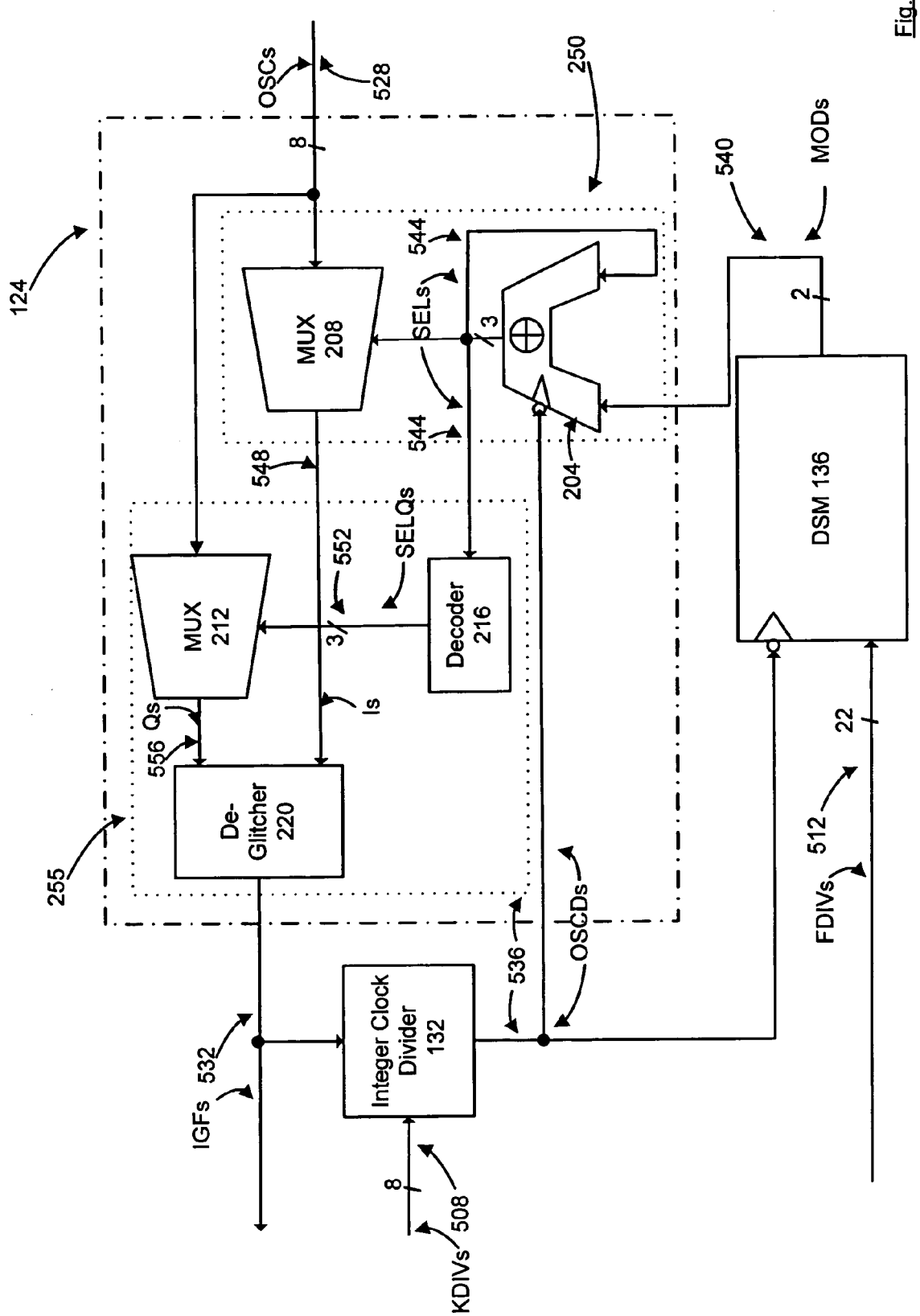
FIG. 4 is a block diagram of a phase rotator fractional divider in accordance with an embodiment of the invention.

DSM 136 is also operable to randomize and spectrally shape quantization error such that when signal MODs is observed for short periods of time (for example substantially shorter than $2^{22}$ clock periods of signal OSCDs in this example), the majority of the power of the quantization error exists at frequencies between one sixth and one half of the frequency of signal OSCDs. In other words, the quantization error is spectrally shaped to reduce the quantization error at lower frequencies by moving more of the quantization error to higher frequencies. Thus, DSM 136 is operable to act as a high-pass quantization noise filter. This allows an increased proportion of the quantization error to be rejected by the low-pass filter of forward portion 108, which determines the loop bandwidth. Since DSM 136 is a discrete-time circuit clocked at the frequency of signal OSCDs, the entire energy in signal MODs is contained in the range of frequencies from DC (zero frequency) up to half the clock frequency of DSM 136, which in the present embodiment is the frequency of OSCDs divided by two.

fractional divider 124 receives the output of DSM 136, signal MODs, through bus 540. In this embodiment bus 540 is a 2 two bit bus capable of carrying the two bit signal MODs. It is to be emphasized that the various components in synthesizer 100 can be implemented in various ways. For example, fractional divider 124, in an embodiment, is implemented according to a block diagram shown in FIG. 4. This exemplary implementation of fractional divider 124 will be discussed in relation to synthesizer 100. Thus the following discussion of fractional divider 124 should be read with reference to both FIGS. 1 and 4.

Describing fractional divider 124 in greater detail, in a present embodiment, fractional divider 124 comprises two structures: a phase rotator frequency divider (PRFD) 250 and a glitch suppressor 255. PRFD 250 is operable to frequency divide its input signal OSCs by rotating between different phases of signal OSCs. Artifacts can occur at this point, known as glitches as described in greater detail below. As used herein, a glitch is an unwanted pulse transition that occurs when PRFD 250 rotates from one phase in a signal OSCs to another phase in signal OSCs. Glitch supressor 255 is operable to suppress glitches in the frequency divided signal.

Continuing with the description of fractional divider 124, PRFD 250 is now described in detail. In a present embodiment, PRFD 250 comprises an accumulator 204, and a dynamic N-to-1 phase-select multiplexer (MUX) 208, and receives three input signals: i) signal OSCs through bus 528, ii) signal MODs, through bus 540, and iii) clock signal OSCDs through line 536. Fractional divider 250 outputs a signal Is through line 548.

Continuing with the description of PRFD 250, accumulator 204 receives two input signals, signal MODs, and clock signal OSCDs. Furthermore, accumulator 204 also receives a feedback of its own output, signal SELs, through bus 544. Accumulator 204 can be implemented in a number of ways known in the art and as described, for example, in B. Miller, B. Conley, IEEE $44^{th}$ Annual Symposium on Frequency Control, "A Multiple Modulator Fractional Divider", May 1990). In a present embodiment, accumulator 204 is a three-bit accumulator and therefore signal SELs is a three bit signal. Accordingly, bus 544, which carries signal SELs, is a three bit bus. (As is apparent to those skilled in the art, in other embodiments, accumulator 204 can use different number of bits. Presently preferred values include two, four, six, eight, and ten and all these embodiments are within the scope of the invention.) Signal SELs, in addition to serving as a feedback signal to accumulator 204, is also supplied to MUX 208.

MUX 208 can be implemented in a number of different manners known to those skilled in the art, and as described, for example, in J. Craninckx, M. Steyaert, IEEE Journal of Solid State Circuits, "A 1.75-GHz/3-V Dual-Modulus Divide-by-128/129 Prescaler in 0.7 um CMOS", July, 1996, and U.S. Pat. No. 5,970,110, Issue Date: Oct. 19, 1999, "Precise, Low-Jitter Fractional Divider using Counter of Rotating Clock Phases". In a present embodiment MUX 208 is an eight-to-one phase select multiplexer. (In other embodiments MUX 208 can have other phase ratios.) In addition to signal SELs, MUX 208 also receives the eight phase signal OSCs through bus 528. MUX 208 is operable to transmit, through line 548, one of the eight phase-modulated input signals OSCs as its output signal Is.

Describing the operation of PRFD 250 in greater detail, in this embodiment, PRFD 250 is a state machine operable to form a frequency divided output Is by phase rotating through its phase-modulated input signal OSCs, and multiplexing these rotations into a single signal. To function as a phase rotating state machine, PRFD 250 maintains different operational states and rotates through these states at the frequency of its clock signal OSCDs. The total number of different operational states PRFD 250 can have is based on the number of phases input signal OSCs has. For example, in this embodiment, input signal OSCs has eight phases, meaning that PRFD 250 can have a total of eight different states.

In a present embodiment, each of the eight distinct operational states of PRFD 250 is represented by a different value. Specifically, the lowest value of zero is used to represent the operational state where the input signal with the earliest phase (i.e. $OSCs_0$) is outputted as Is. The highest value of seven is used to represent the operational state where the input signal with the latest phase (i.e. $OSCs_7$) is outputted as signal Is. For example, if PRFD 250 sends signal $OSCs_0$ to line 532, then the current state of PRFD 250 is zero. Alternatively, if signal $OSC_1$ is being sent to line 532, then the current state of PRFD 250 is one. (However, those of skill in the art will now recognize that in other implementations of PRFD 250 different methods of representing states and their relationships could be used and these implementations are also within the scope of the invention.)

Continuing with the present embodiment, two operational states of PRFD 250 are considered to be adjacent if the two different input signals outputted at those two states are separated by one-eighth of an OSCs period. Continuing with the above example, since signals $OSC_0$ and $OSC_1$ are separated by one-eighth of an OSCs period, state zero and state one are adjacent. Similarly, state two is adjacent to state one. Moreover, in a present embodiment, some states are considered to be adjacent states. For example, state two is the next adjacent state from state one since the phase of signal $OSCs_2$ is forward in time by one-eighth of a period of OSCs relative to signal $OSC_1$. Conversely, state zero is the previous adjacent state from state one since the phase of signal $OSCs_0$ is backward in time by one-eighth of a period of OSCs relative to signal $OSCs_1$. It should be noted that according to this method of representing states, state zero and state seven are adjacent, state zero being the next adjacent state from state seven.

Accumulator 204 is operable to store and update the operational states of PRFD 250 using binary encoding. Thus, for example, accumulator 204, being a three bit accumulator, can store state zero as binary value 000, state one as the binary value 001, and state two as the binary value 010. Furthermore, state values stored by accumulator 204 can be updated, at the frequency of clock signal OSCDs, by adding the value of input signal MODs to the value of feedback signal SELs. In this embodiment, input signal MODs can cause the next state stored by accumulator 204 to be the previous adjacent state when MODs is set to negative one (i.e., count down), to remain the same when MODs is set to zero (i.e., do not count), or to be the next adjacent state when MODs is set to positive one (i.e. count up). For example, if the state stored by accumulator 204 is 011 (i.e. state 3) and the value of signal MODs is 01 (i.e. positive one), when accumulator 204 is updated next according to clock signal OSCDs, the stored state value will be updated to 100 (i.e. state 4).

As it should now be apparent to those skilled in the art, in this embodiment, PRFD 250 can only rotate to adjacent states at each update of accumulator 204. For example, at each update, the state stored can change from state two to an adjacent state such as state one, but does not change from state two to a non-adjacent state such as state five. In other embodiments, rotating to non-adjacent states at individual updates can become possible by altering the coding of MODs. For example, by making MODs a three-bit signal representing the values ranging from negative three to positive three, accumulator 204 becomes operable to move up to three adjacent states at each update. For example, according to this alternative embodiment, if the value of MODs is positive three and the current state stored is zero, the next state of fractional divider 124 would be three, a state non-adjacent to state zero.

Accumulator 204 is operable to convey, to MUX 208, through signal SELs, the binary value representing the currently stored state. MUX 208 is operable to use the value of signal SELs to select a phase of the input signal OSCs to be transmitted as its output signal Is. For example, a value of 001 carried by SELs causes MUX 208 to output phase OSCs, as signal Is. As the value of signal SELs changes, so does the phase outputted by MUX 208. In other words, MUX 208 rotates through different phases of its input signal OSCs according to the content of signal SELs at the frequency of clock signal OSCDs. This phase rotation operation allows MUX 208 to output a signal Is, the frequency of which is fractionally varied from the frequency of the input signal OSCs.

Figure 5:
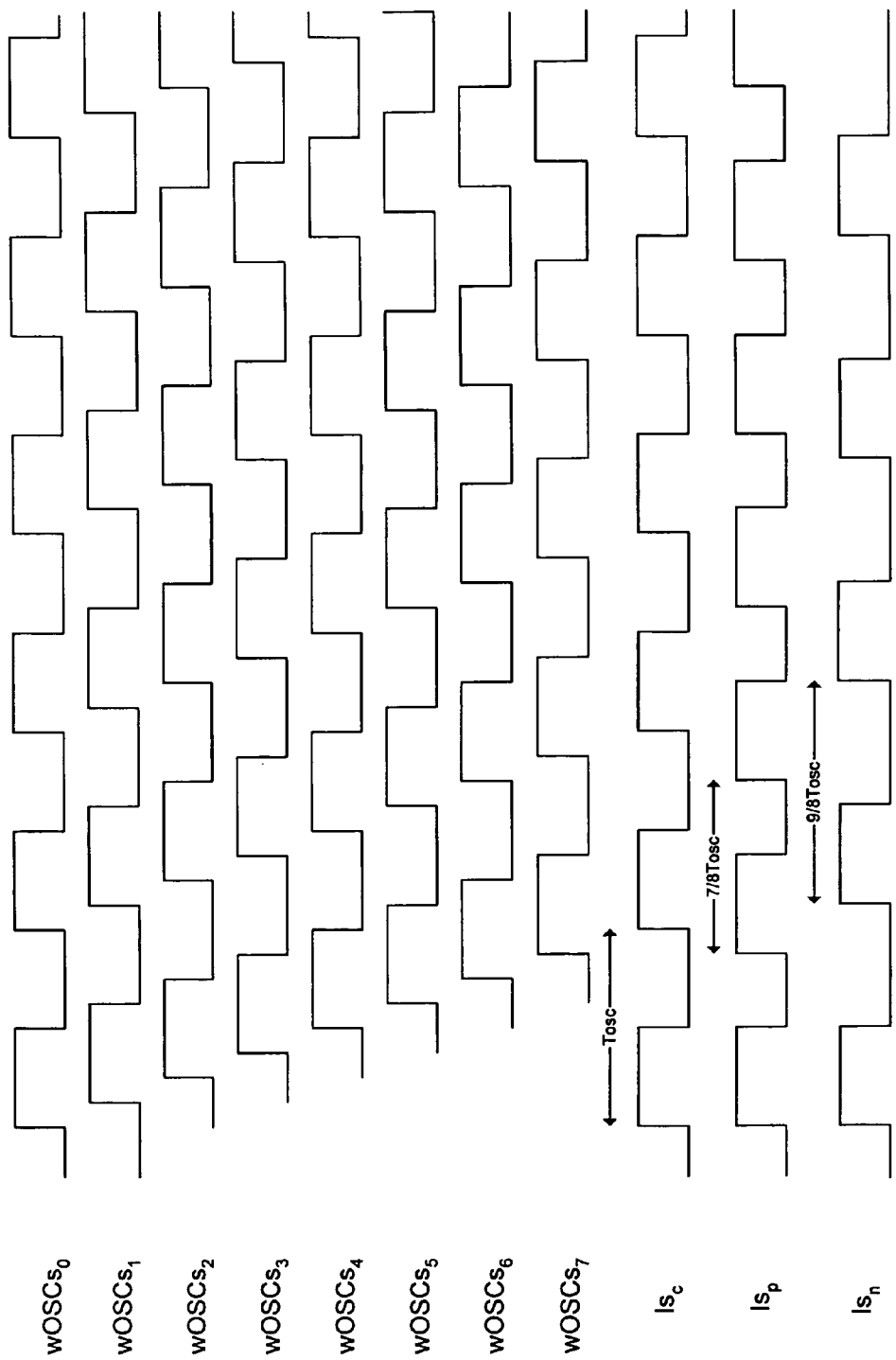
FIG. 5 is an exemplary set of waveforms for use in phase rotator fractional divider of FIG. 4.

To illustrate fractional frequency alteration that can be performed by PRFD 250, FIG. 5 shows an example comprising waveforms $wOSCs_0$ through $wOSCs_7$ corresponding to the eight phases of the input signal OSCs and three waveforms $wIs_s$, $wIs_p$ and $wIs_n$ corresponding to three different output signals, Is, that MUX 208 can generate during three different operational modes. In this example, it is assumed that the current state stored by accumulator 204 is state zero. During the first example operational mode, when MUX 208 generates waveform wIs$_c$ a fixed value is chosen for signal FDIVs such that DSM 136 sends, to accumulator 204, a constant signal MODs with a value of zero. Accordingly, MUX 208 continually outputs the same input phase, in this example, waveform wOSCs$_0$. The frequency of waveform wIs$_c$ is, thus, the same as the frequency of waveform wOSCs$_0$, resulting in an unaltered output signal frequency.

During the second example operational mode when MUX 208 generates waveform wIs$_n$, a fixed value is chosen for signal FDIVs such that DSM 136 sends, to accumulator 204, a constant signal MODs with a value of negative one. As accumulator 204 is updated in accordance with clock signal OSCDs, the current state stored decreases by one in accordance with MODs, moving the current state to the previous adjacent state. The periodic change in current state stored is reflected in the value transmitted by signal SELs, causing MUX 208 to rotate through its input phases. Accordingly, as specified by signal SELs, with each update, MUX 208 selects, for outputting, the OSCs phase that is backward in time by one-eighth of a period of a period of OSCs from the OSCs phase selected during the previous rotation. Thus, in this example, different phases of input signal OSCs are outputted as waveform wIs$_n$ starting with waveform wOSCs$_0$, and continuing with waveform wOSCs$_7$, then waveform wOSCs$_6$, and so on. Accordingly, each period of waveform wIs$_n$ is reduced by one-eighth of a signal OSCs' period (i.e. ($\frac{1}{8}$)*Tosc where T$_{osc}$ is a single period of signal OSCs) such that each period of waveform Is$_n$ is $\frac{7}{8}$*Tosc. This smaller period results in a higher frequency waveform wIs$_n$. Namely, f$_{Is}$, the frequency of waveform wIs$_n$, is equal to ($\frac{8}{7}$)*f$_{osc}$ where f$_{osc}$ is the frequency of signal OSCs.

During the third example operational mode when MUX 208 generates waveform wIs$_p$, a fixed value is chosen for signal FDIVs such that DSM 136 sends, to accumulator 204, a constant signal MODs with a value of positive one. As accumulator 204 is updated in accordance with clock signal OSCDs, the current state stored increases by one in accordance with MODs, moving the current state to the next adjacent state. The periodic change in current state stored is reflected in the value transmitted by signal SELs, causing MUX 208 to rotate through its input phases. Accordingly, as specified by signal SELs, with each update, MUX 208 selects, for outputting, the phase of signal OSCs that is forward in time by one-eighth of a period from signal OSCs' phase selected during the previous rotation. Thus, in this example, different phases of input signal OSCs are outputted as waveform wIs$_p$ starting with waveform wOSCs$_0$, and continuing with waveform wOSCs$_1$, then waveform wOSCs$_2$, and so on. Accordingly, each period of waveform wIs$_p$ is increased by one-eighth of an OSCs period (i.e. ($\frac{1}{8}$)*Tosc where T$_{osc}$ is a single period of OSCs) such that each period of waveform Is$_p$ is $\frac{9}{8}$*Tosc. This larger period results in a lower frequency waveform Is$_p$. Namely, f$_{Is}$, the frequency of waveform Is$_p$, is equal to ($\frac{8}{9}$)*f$_{osc}$ where f$_{osc}$ is the frequency of signal OSCs.

As will now be apparent to those skilled in the art, the resolution and range of frequency alterations MUX 208 can perform depends on a number of criteria. In this embodiment, these criteria include the number phases of the input signal OSCs, and the resolution of the signals FDIVs and MODs. For example, in this embodiment, the input signal OSCs has eight phases, each phase being separated by one-eighth of a signal OSCs period. Moreover, signal FDIVs has a resolution of twenty two bits, and signal MODs is a pseudo-random two-bit bit-stream. Accordingly, the frequency of the output signal Is can be varied from the frequency of signal OSCs, by any one of $2^{22}$ equally spaced factors between negative one-eighth and positive one-eighth of the frequency of signal OSCs. The range and the resolution of possible frequency variations also depends on integer division control signal KDIVs. For example, if signal KDIVs has a value of two, the range of frequency alterations become negative one sixteenth to positive one sixteenth of the frequency of signal OSCs and if the modulator input is still a twenty two bit number then the frequency of signal OSCs can be varied by $2^{22}$ equally spaced factors between negative one-sixteenth and positive one-sixteenth of the frequency of signal OSCs. Accordingly, changing the value of signal KDIVs that is inputted to integer divider 132 can also be used to enable balancing fractional division range with fractional division resolution.

Figure 6:
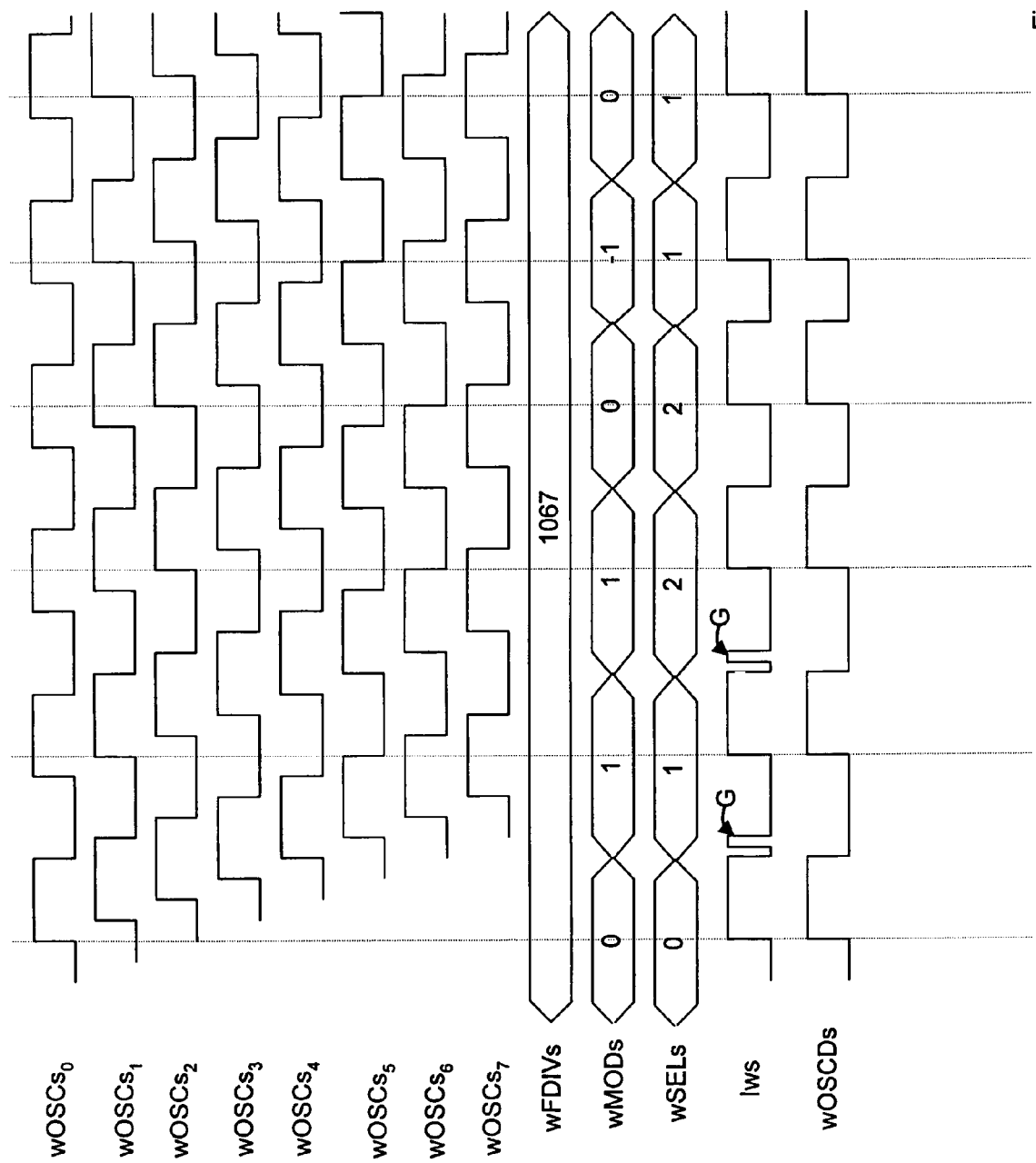
FIG. 6 is another exemplary set of waveforms for use in phase rotator fractional divider of FIG. 4.

A combination of fractional alterations carried out by MUX 208 renders PRFD 250 operable to fractionally divide the frequency of its input signal and transmit the frequency divided signal as its output signal Is. Referring to FIG. 6, an example is shown comprising example waveforms wOSCs$_0$ to wOSCs$_7$ corresponding to the eight phases of the input signal OSCs and also waveforms wMODs, wSELs, wIs, and wOSCDs corresponding to signals MODs, SELs, Is, and OSCDs. In this example, waveform OSCDs roughly tracks waveform OSCs$_0$. This represents the case where signal KDIVs is set to one such that no division is performed by integer frequency divider integer clock divider 132. Also, the input to DSM 136, signal FDIVs, is chosen to be a static digital word that has a constant value of 1067. It is assumed that, at some point during its operation, DSM 136, in accordance with the value chosen for FDIVs, outputs a sequence of values comprising zero, one, one, zero, negative one, and zero as the content of signal MODs. This example covers the time period corresponding to this point in the operation of PRFD 250.

At the start of the example, PRFD 250 is assumed to be at the operational state zero. Hence, as shown in FIG. 6, initially, accumulator 204 stores and outputs, as waveform wSELs, the operational state zero. Accordingly, the output of MUX 208, waveform Is, corresponds to waveform OSCs$_0$. As indicated by waveform wSELs in FIG. 6, as waveform wMODs changes according to waveform wOSCDs, accumulator 204 rotates through the following states: zero, one, two, two, one, one. In turn, MUX 208 relays the phase of signal OSCs corresponding to the operational state conveyed by waveform wSELs to waveform Is. Accordingly, MUX 208 rotates through the following phases of signal OSCs: OSCs$_0$, OSCs1, OSCs2, OSCs2 OSCs1, and OSCs1. The resulting waveform wIs is a mosaic of components of each of the above input signal phases, with a frequency that is a fraction of the frequency of the sample signal OSCs.

As it can also be seen in FIG. 6, waveform wIs contains two glitches indicated at G. Glitch suppressor 255 is operable to remove these glitches and will now be described in detail. Glitch suppressor 255 comprises a decoder 216, a multiplexer (MUX) 212, and a de-glitcher 220. Glitch suppressor 255 receives, through line 548, the output signal of PRFD 250, signal Is. The selection signal SELs outputted by accumulator 204 of PRFD 250 is also received as an input signal through bus 544. Glitch suppressor 255 additionally receives the eight phase input signal of fractional divider 124, signal OSCs, through bus 528. Glitch suppressor 255 outputs, through line 532, signal IGFs, which is also the output signal of fractional divider 124.

Decoder 216 is a combination logic digital block, known to those skilled in the art, that receives the signal SELs and outputs the signal SELQs, where signal SELQs is a 90° degree phase shifted version of signal SELs. Decoder 216 receives input signal SELs through bus 544. Decoder 216 decodes signal SELs and outputs signal SELQs, which serves as the selector signal for a dynamic N-to-1 phase-select multiplexer (MUX) 212.

MUXs 212, similar to MUX 208, can be implemented in a number of different ways known to those skilled in the art, and as described, for example, in J. Craninckx, M. Steyaert, IEEE Journal of Solid State Circuits, "A 1.75-GHz/3-V Dual-Modulus Divide-by-128/129 Prescaler in 0.7 um CMOS", July, 1996, and U.S. Pat. No. 5,970,110, Issue Date: Oct. 19, 1999, "Precise, Low-Jitter Fractional Divider using Counter of Rotating Clock Phases". In a present embodiment MUX 212 is an eight-to-one phase select multiplexer. (As previously discussed, in other embodiments the phase select ratio can change.) The selector signal SELQs is provided to MUX 212 through a 3 bit bus 552. MUX 212 also receives signal OSCs, as an input, through bus 528. MUX 212 is operable to select one of its eight input signals according to the value of signal SELQs and transmit the selected signal as signal Qs through line 556.

Figure 7:
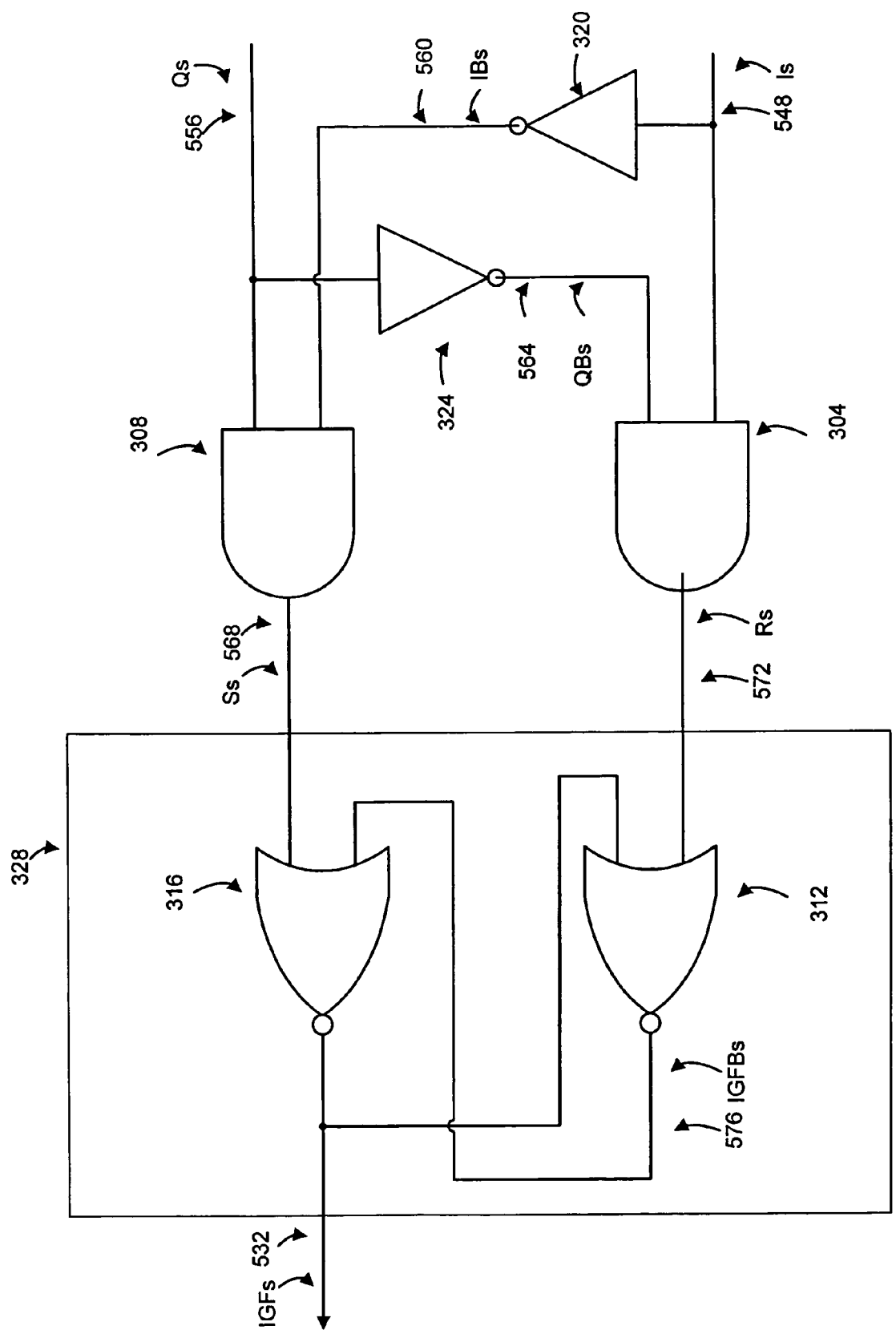
FIG. 7 is a block diagram of a glitch suppressor in accordance with an embodiment of the invention.

Signals Is and Qs, are received by de-glitcher 220 through lines 548 and 556 respectively. Signal IGFs is outputted from de-glitcher 220 and thus fractional divider 124 through path 532. de-glitcher 220 can be implemented in a variety of different manners. FIG. 7 shows, for example, a possible implementation of de-glitcher 220 according to a block diagram. (However, in other embodiments other implementations are possible and are within the scope of the invention). This exemplary implementation of de-glitcher 220 will be discussed in relation to both fractional divider 124 and synthesizer 100. Thus, the following discussion of de-glitcher 220 should be read with reference to FIGS. 1, 4 and 6.

Referring to FIG. 7, de-glitcher 220 comprises two AND gates 304 and 308 whose outputs are connected to two cross-coupled NOR gates 312 and 316 respectively. Two inverters 320 and 324 receive the input signals Is and Qs through lines 548 and 546 and generate compliment signals IBs and QBs respectively. The two complementary signals IBs and QBs are delivered to two AND gates 308 and 312 through lines 560 and 564 respectively. AND gate 308 delivers its output signal Ss to NOR gate 316 through line 568. AND gate 304 delivers its output signal Rs to NOR gate 312 through line 572. The output of NOR gate 312, signal IGFBs, is delivered to an input of NOR gate 316 through line 576, and the output of NOR gate 316, signal IGFs is delivered to an input of NOR 312 gate through line 532. Signal IGFs is also the glitch free output signal of fractional divider 124.

As will be recognized by those skilled in the art, the cross-coupled combination of NOR gates, where the output of one NOR gate is connected to one of the inputs of the other NOR gate and vice versa, forms, what is commonly referred to as an RS latch (indicated at 328 in FIG. 7). However, in other embodiments, the functionality of RS latch 328 can be accomplished using alternative implementations. For example, cross coupled NAND gates can be substituted for the cross-coupled NOR gates. These embodiments are within the scope of the invention.

Referring again to FIG. 4, continuing with the description of fractional divider 124, the operation of glitch suppressor 255 is now discussed in detail. In a present embodiment decoder 216 decodes signal SELs by adding two to its value. In a present embodiment decoder 216 is a two-complement adder that implements the equation $$\text{SELQs} = (\text{SELs} + 2) \text{ MOD } Np \qquad \text{(Equation 4)}$$

In Equation 4, Np is the number of phases VCO 120 generates. This implementation prevents overflows by providing to wrap around. For example, if the range of appropriate values for signal SELs is between zero seven and Np is eight, then when signal SELs has a value of six signal SELQs will have a value of zero (6+2 MOD8). The addition of two to SELs' value results in a selection signal SELQs which is then transmitted to MUX 212 through path 552.

MUX 212 operates in substantially the same manner as MUX 208, and is operable to form a frequency divided output Qs by phase rotating through its phase-modulated input signal OSCs, according to selection signal SELQs and multiplexing these rotations into a single signal. Signal Qs is substantially the same as signal Is, however, the use of signal SELQs in place of signal SELs causes signal Qs, to be about 90° (or one quarter of a period of signal Is) out of phase with output signal Is. In other words, since each phase of the eight phase signal OSCs is phase shifted by about 45° then two signals that are two adjacent phases apart are shifted in phase by about 90°. Namely, signal Qs is a quadrature clock signal. It will be apparent to those skilled in the art that in other embodiments, different decoding operations may be chosen based on various criteria such as the number of phases in Signal OSCs, the desired amount by which signal Qs is to be out of phase with signals Is, and the ease and simplicity with which the decoding operation may be implemented. Moreover, signal Qs does not have to be an exact quadrature clock and that other variations in phase between signal Qs and signal Is are also within the scope of the invention Continuing with the operation of glitch suppressor 255, de-glitcher 220, utilizes signal Qs to suppress glitches present in signal Is and output this substantially glitch free signal as its output signal IGFs. In general terms, de-glitcher 220 suppresses glitches using time hysteresis. Time-hysteresis can be accomplished using a number of different implementations and these implementations are within the scope of this invention. For example, in a present embodiment, for a duration of about 90° around each transition of the output signal IGFs, opposite transitions (glitches) are inhibited. Namely, depending on the value of signal Qs, transitions on output signal IGFs can only occur in one direction. Thus, when Qs has a value of one, then one-to-zero transitions are inhibited on the output signal IGFs and when Qs has a value of one, then zero-to-one transitions are inhibited on the output signal IGFs. More generally, this can be viewed as a time hysteresis around each output clock transition where opposite transitions (glitches) are inhibited. de-glitcher 220 inhibits reverse transitions of signal Is from a value of one to zero within about 90° of the time point where signal Is transitions to a value of one. Similarly, de-glitcher 220 also inhibits reverse transitions of signal Is from a value of zero to one within about 90° of the time point where signal Is transitions to a value of zero. Since glitches typically occur in the about 90° duration after a clock transition and consist of a brief reverse transition of a signal's value, de-glitcher 220 can suppress these glitches.

Figure 8:
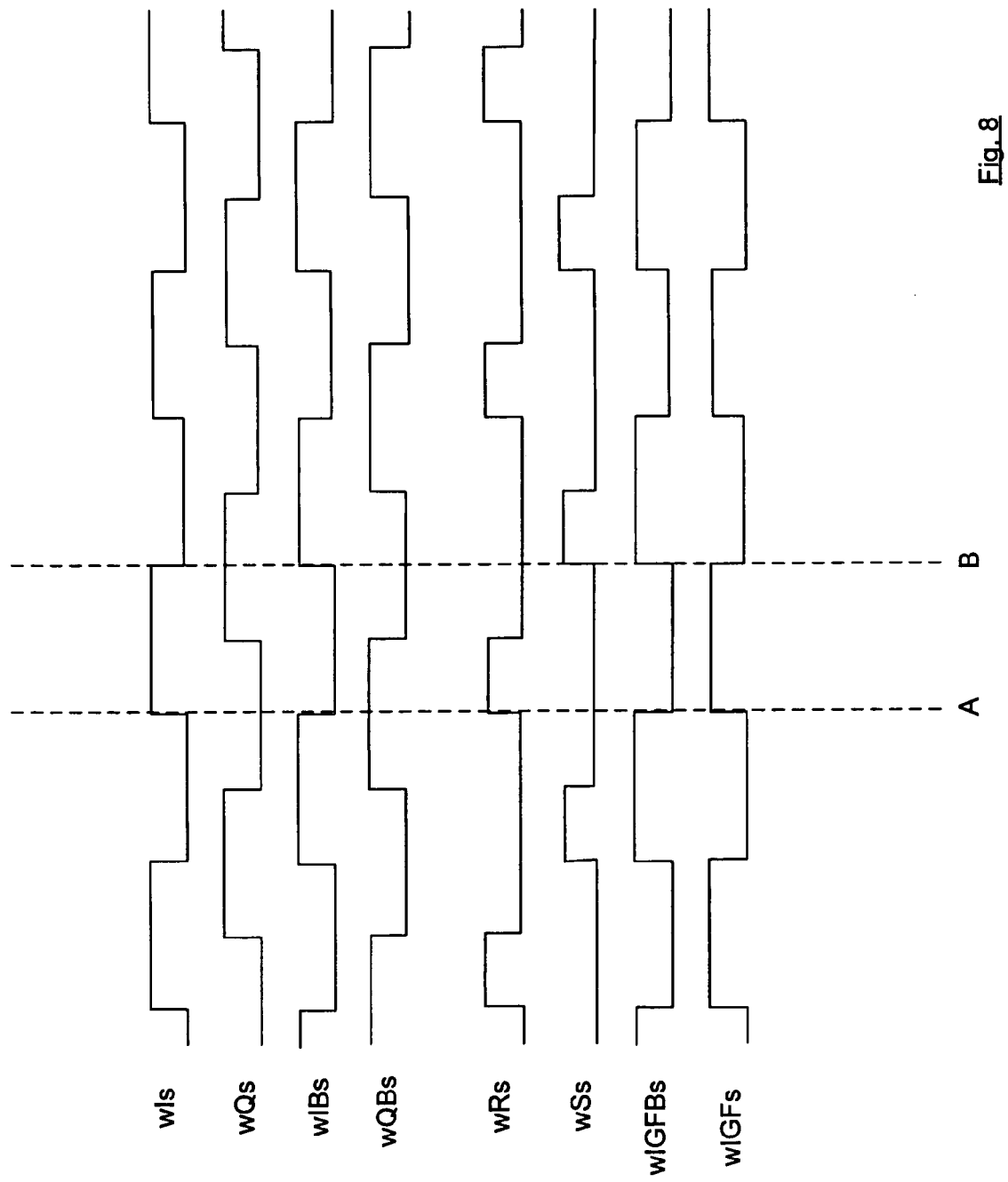
FIG. 8 is an exemplary set of waveforms for use in glitch suppressor of FIG. 7.

Referring now to FIG. 8, operation of de-glitcher 220 is described where there is no glitch present in input signal Is. FIG. 8 shows example waveforms wIs, wQs, wIBs, wQBs, wRs, wSs, wIGFBs, and wIGFs corresponding to signals Is, Qs, IBs, QBs, Rs, Ss, IGFBs, and IGFs. As shown in FIG. 8, the two input waveforms wIs and wQs and their complements wIBs, and wQBs are equally spaced across one clock period. Namely, each signal is phase shifted by one quarter of a clock period or 90°. These waveforms control the operational state of RS latch 328, which in turn control the value of RS latch 328's output.

As will be apparent to those skilled in the art, RS latch 328 has four possible operational states three of which are used in this embodiment. Each state determines the value of the output signal IGFs. The first state, the hold state, occurs when both input signals Rs and Ss are set to a value of zero. In this state, the value of the output signal IGFs continues to be the same as it was immediately prior to transitioning to this state. The second state, the reset state, occurs when signal Rs is set to a value of one and signal Ss is set to a value of zero. In this state output signal IGF is set to a value of one. The third state, set state, occurs when signal Rs is set to zero and signal Ss is set to one. In this state the output signal IGFs is forced to zero. The last possible state, where both signals Rs and Ss are set to one, is not utilized in this embodiment. This is because in this embodiment, AND gates 304 and 308 prevent signals Rs and Ss from having a value of one simultaneously: since signals Is and IBs as well as signals Qs and QBs are complimentary signals, only one of Is or IBs (or Qs and QBs) can have a value of one at any given time, forcing the input of at least one AND gate to a value of zero.

Continuing with the example, in response to the waveforms in FIG. 8, RS latch 328 goes through the following sequence of states with each state having a duration of 90°: reset, hold, set, hold, reset, hold, etc. These states, in turn determine the value of output waveform wIGFs. To illustrate this further, as shown at time point A in FIG. 8, under normal glitch-free operation, when waveform wIs changes to a value of one (and thus waveform wIBs to a value of zero), waveform wRs, the output signal of AND gate 304, transitions to a value of one, which is the reset state. Accordingly, waveform wIGFBs transitions to a value of zero and waveform wIGFs transitions to a value of one shortly thereafter. When waveform Is transitions to a value of zero at time point B (and waveform IBs transitions to a value one), waveform Ss, the output signal of AND gate 308, transitions to a value of one, which is the set state. Accordingly, signal IGFs changes to a value of zero and signal IGFBs changes to a value of one shortly thereafter.

Figure 9:
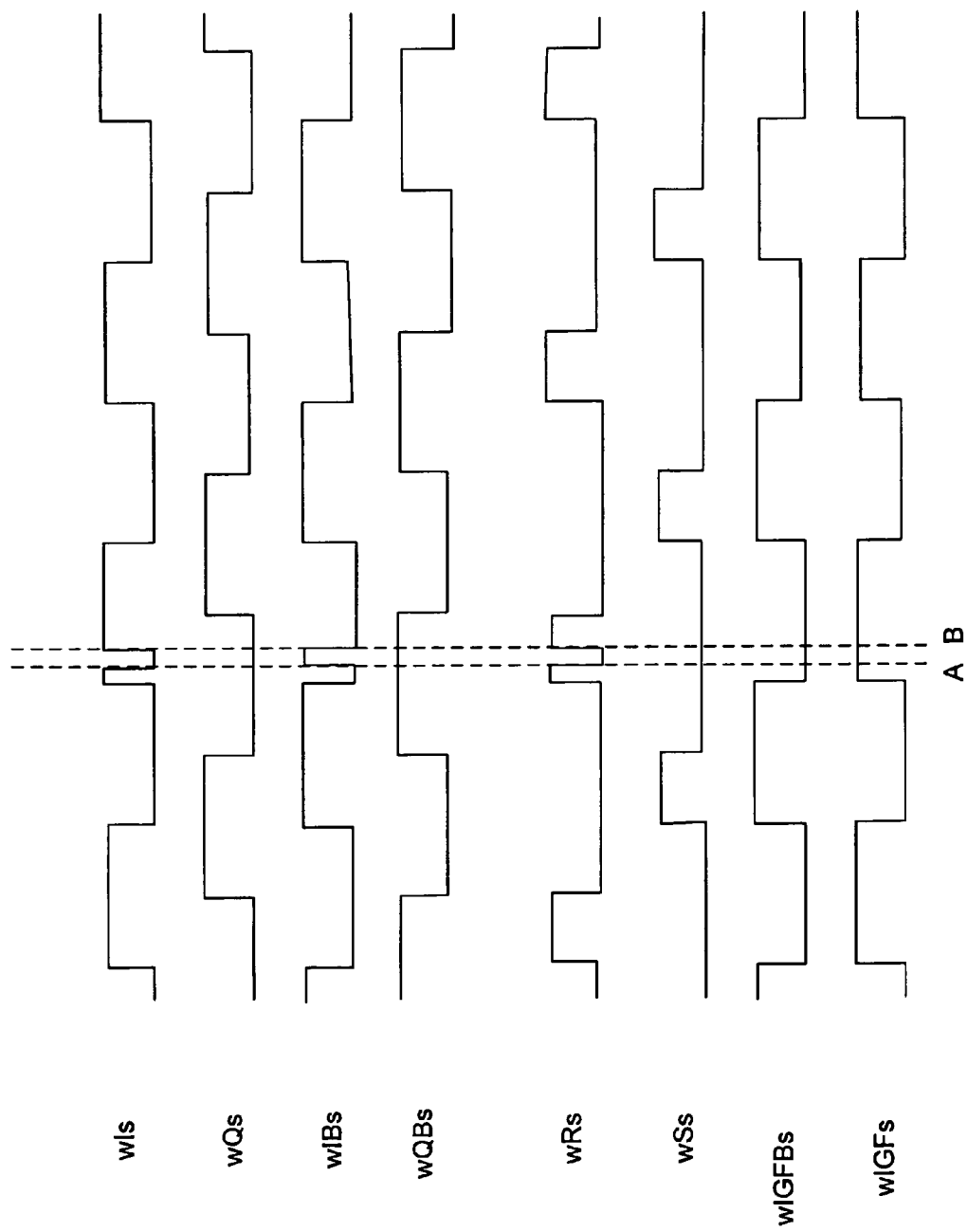
FIG. 9 is another exemplary set of waveforms for use in glitch suppressor of FIG. 7.

FIG. 9 shows waveforms wIs, wQs, wIBs, wQBs, wRs, wSs, wIGFBs, wIGFs corresponding to signals Is, Qs, IBs, QBs, Rs, Ss, IGFBs, IGFs to illustrate the occurrence and suppression of a glitch by de-glitcher 220. Specifically, as shown between time points A and B, waveform wIs transitions to a value of one and then shortly thereafter, transitions back to a value of zero for a brief time and then back to a value of one again. The transition of waveform wIs to a value of zero and shortly thereafter back to a value of one is considered to be a glitch. However, de-glitcher 220 does not propagate the glitch to waveform wIGFs. This is because waveform wQs is at a value of zero from about 90° before the transition of waveform wIs to a value of one, until about 90° after this time. This period is the time hyteresis period where AND gate 308 is disabled preventing the propagation of the glitch to output waveform wIGFs. Although not shown in the example, de-glitcher 220 similarly suppresses the transmission of glitches that occur shortly after signal Is transitions to a value of zero. In that case, the glitch is not propagated to the output signal IGFs since at the time of the glitch signal QBs is at a value of zero disabling AND gate 304. Those skilled in the art will also recognize that although the above example showed the case of a glitch on signal Is, in other embodiments de-glitcher 220 can also performs glitch removal on signal Qs in a similar manner. These embodiments are within the scope of the invention.

While only specific combinations of the various features and components of the present invention have been discussed herein, it will be apparent to those of skill in the art that subsets of the disclosed features and components and/or alternative combinations of these features and components can be utilized, as desired. For example, in one variation, higher order delta-sigma modulators, implemented by cascading lower order modulators can be used to implement DSM 136, allowing for a pipelined digital implementation and therefore, allowing DSM 136 to operate at higher clock rates than a non-pipelined implementation. In other variations, DSM 136 can be implemented as analog or digital. In yet other variations, fractional divider 124 can be controlled by a controller other than a delta-sigma modulator such as by an accumulator (as described in J. Craninckx, M. Steyaert, IEEE Journal of Solid State Circuits, "A 1.75-GHz/3-V Dual-Modulus Divide-by-128/129 Prescaler in 0.7 um CMOS", July, 1996).

In other variations, the fractional division functionality of fractional divider 124 (i.e. PRFD 250) can be implemented using fractional dividers other than a phase rotator fractional divider such as a high frequency fractional divider described in J. Craninckx, M. Steyaert, IEEE Journal of Solid State Circuits, "A 1.75-GHz/3-V Dual-Modulus Divide-by-128/129 Prescaler in 0.7 um CMOS", July, 1996. In yet other variations, fractional divider 124 can be implemented without a glitch suppressor 255, conveying output signal Is of PRFD 250 as output IGFs.

In further variations, glitch suppressor 255 can be implemented using different methods for generating quadrature clocks. For example delay circuits or a delay locked loops can be used for generating signal Qs. In other variations, glitch suppressor 255 can be used in combination with other types of synthesizers or devices. For example, those skilled in the art will recognize that glitch suppressor 255 can be combined with integer-N synthesizers of fractional-N synthesizers with different architectures. These variations are within the scope of the invention.

In other variations, different encoding techniques could be used to represent the MUX selection bits. For example, the use of "Grey coding" allows PRFD 250 to be more robust against possible glitches. In Grey coding, the binary representation of adjacent states are chosen such that they do not differ by more than one bit. This can guard against certain timing errors during phase rotations.

In another variation, fractional divider 124 can be implemented as a four, six, ten or twelve phase rotator. Accordingly, in these variations, VCO 120 would be constructed to supply the number of phase modulated outputs corresponding to the number of phases fractional divider 124 can rotate between.

In a further variation, synthesizer 100 can be constructed so that an integer frequency divider divides the reference signal REFs prior to reaching forward portion 108. In yet another variation, the output signal Os could be divided by an integer divider prior to being sent out of synthesizer 100. Use of integer dividers both at the reference signal and at the output signal allows greater control over the synthesizer 100's output frequency range.

In yet other variations integer clock divider 132 may not be utilized. This is the same operational condition as setting signal KDIVs to a value of one. This specification makes reference to a number of documents, including, but not limited to, various academic articles and issued patents. All such documents are incorporated herein by reference.

We claim:

1. A device for synthesizing a frequency comprising:
a forward portion having a reference input for receiving a reference clock signal and a feedback input for receiving a feedback signal; said forward portion having a forward portion output; said forward portion operable to generate an oscillating signal based on a phase or a frequency or a phase and frequency difference between said reference and feedback inputs; said oscillating signal being delivered from said forward portion output;
a delta-sigma modulator (DSM) having a DSM clock input for receiving a first driving clock signal; said DSM having a DSM input for receiving a high resolution input signal; said first driving clock signal having a frequency greater than said reference clock signal; said DSM having a DSM output; said DSM operable to generate a quantized bit-stream signal from said high resolution input signal that is delivered from said DSM output;
a fractional divider having a fractional divider input connected to said forward portion output for receiving said oscillating signal; said fractional divider having a control input connected to said DSM output for receiving said bit-stream signal; said fractional divider having a fractional divider driving clock input for receiving a second driving clock signal; said fractional divider having a fractional divider output for delivering a fractionally divided signal; said fractional divider operable, according to said bit-stream signal, to generate said fractionally divided signal having a frequency that is a fraction of said oscillating signal's frequency; and,
a feedback integer divider (FID) having a first FID input for receiving a representation of an integer value; said FID having a second FID input connected to said fractional divider output for receiving said fractionally divided signal; said FID having an FID output connected to said feedback input; said FID operable to frequency divide said fractionally divided signal by said integer value in order to generate said feedback signal.

2. Device of claim 1, wherein said first driving clock signal and said second driving clock signal are substantially identical.

3. Device of claim 1, wherein said DSM clock input is connected to said fractional divider output and said first driving clock signal is the same as said fractionally divided signal.

4. Device of claim 1, wherein said first driving clock signal is said fractionally divided signal, frequency divided by an integer value.

5. Device of claim 4, further comprising an integer clock divider (ICD) having a first ICD input for receiving a representation of an integer value; said ICD having a second ICD input connected to said fractional divider output for receiving said fractionally divided signal; said ICD having an ICD output connected to said DSM clock input; said ICD operable to frequency divide said fractionally divided signal by said integer value in order to generate said first driving clock signal.

6. Device of claim 2, wherein each of said first driving clock signals and said second driving clock signal comprise said fractionally divided signal.

7. Device of claim 6, wherein each of said first driving clock signals and said second driving clock signal are frequency divided by an integer value.

8. Device of claim 1, wherein said oscillating signal has a plurality of phase-shifted signals having substantially identical frequencies.

9. Device of claim 8, wherein said fractional divider is a phase rotator frequency divider (PRFD); said PRFD operable to generate said fractionally divided signal by rotating between phases of said phase-shifted signals according to said bit-stream signal.

10. Device of claims 8 or 9, wherein said plurality of phase-shifted signals comprise eight signals of unique phases; said phases differing by one-eighth of a cycle from each other.

11. Device of claims 8 or 9, wherein said plurality of phase-shifted signals comprise of four signals of unique phases; said phases differing by an one-fourth of a cycle from each other.

12. Device of claims 8 or 9, wherein said plurality of phase-shifted signals comprise of six signals of unique phases; said phases differing by an one-sixth of a cycle from each other.

13. Device of claims 8 or 9, wherein said plurality of phase-shifted signals comprise of ten signals of unique phases; said phases differing by an one-tenth of a cycle from each other.

14. Device of claims 8 or 9, wherein said plurality of phase-shifted signals comprise of twelve signals of unique phases; said phases differing by an one-twelfth of a cycle from each other.

15. Device of claim 1, wherein said high resolution input is variable in time.

16. Device of claim 1, wherein said DSM is a second order DSM.

17. Device of claim 1, wherein said DSM is a third order DSM.

18. Device of claim 1 wherein said fractional divider further comprises a phase rotator having a first input for receiving said fractional divider input at a first frequency; and a first output for delivering a rotated signal having a second frequency; said phase rotator operable to generate a rotated signal from said fractional divider input by a plurality of rotations between phases of said phase-shifted signals.

19. Device of claim 18 wherein said fractional divider further comprises a glitch suppressor having a first input for receiving a suppressor signal generated from said fractional divider input; a second input for receiving a rotated signal; and a first output for delivering the fractionally divided signal; said glitch suppressor operable to generate said fractionally divided signal based on an inhibition of reverse transitions for a period around a transition of said rotated signal.

20. Device of claim 19 wherein said transition of said rotated signal is a one-to-zero transition and said corresponding reverse transition is a zero-to-one transition or said transition of said rotated signal is a zero-to-one transition and said corresponding reverse transition is a one-to-zero transition.

21. Device of claim 19 wherein said period is about 90° before and after said transition.

22. Device of claim 19 wherein said suppressor signal is a quadrature clock signal.

23. Device of claim 19, wherein said second frequency for said first output of said phase rotator is smaller than said first frequency for said first input of said phase rotator.

24. Device of claim 23 wherein said phase rotator is operable as part of a feedback portion of a frequency synthesizer having a frequency synthesizer output for delivering said fractional divider input and a feedback input for receiving said rotated signal.

25. Device of claim 24 wherein the DSM controls said plurality of rotations for said phase rotator.

26. Device of claim 25 wherein said frequency synthesizer has a synthesizer input for receiving a reference clock; said DSM having a clock input for receiving a second clock signal oscillating at a higher frequency than said reference clock.

27. Device of claim 26 wherein said fractional divider input has more than four phases.

28. Device of claim 19 wherein said glitch suppressor further comprises a de-glitcher that comprises:
   a first complement generator having a first complement input for receiving said rotated signal at a first phase; said first complement generator having a first complement output for delivering a complemented rotated signal that is a complement of said rotated signal;
   a second complement generator having a second complement input for receiving a suppressor signal substantially identical to, and phase delayed by a delay period from said rotated signal by a delay circuit; said second complement generator having a second complement output for delivering a complemented suppressor signal that is a complement of said suppressor signal;
   a first gate having a first input for receiving said rotated signal; said first gate having a second input connected to said second complement output for receiving said complemented suppressor signal; said first gate having a first output for delivering a reset signal;
   a second gate having a third input for receiving said suppressor signal; said second gate having a fourth input connected to said first complement output for receiving said complemented rotated signal; said second gate having a second output for delivering a set signal; and
   an RS Latch having a set input connected to said second output for receiving said set signal; said RS Latch having a reset input connected to said first output for receiving said reset signal; said RS Latch having an RS Latch output for delivering an output signal; said RS Latch operable to inhibit propagation of reverse transitions in said rotated signal for said delay period before and after a transition of said rotated signal.

29. Device of claim 28 wherein said RS Latch is implemented using cross-coupled combination of NOR gates and said first and second gates are AND gates.

30. Device of claim 28 wherein said RS Latch is implemented using cross-coupled combination of NAND gates and said first and second gates are OR gates.

31. Device of claim 28 wherein said suppressor signal is phase delayed from said rotated signal by about 90°.

32. Device of claim 28, wherein said rotated signal is generated by a first phase rotator fractional divider having a first control input for receiving a first control signal.

33. Device of claim 32 wherein said suppressor signal is generated based on said rotated signal using a second phase rotator fractional divider having a second control input for receiving a second control signal that is generated by decoding said control signal.

34. A frequency synthesizer for generating an output signal at a first frequency from a reference signal at a second frequency, said first frequency being a real number multiple of said second frequency; said synthesizer comprising:
   a forward portion having a first input for receiving said reference signal; said forward portion having a second input for receiving a feedback signal; said forward portion having a first output for delivering said output signal; said forward portion operable to generate said output signal based on a cooperation of said reference signal and said feedback signal;
   a feedback portion having a third input for receiving said output signal from said first output; said feedback portion having a feedback output for delivering said feedback signal to said second input; said feedback portion for generating said feedback signal based on a frequency division of said output signal; and
   said feedback portion including a delta sigma modulator (DSM) for controlling said frequency division; said DSM having a fourth input for receiving a clock signal derived from said feedback portion, said clock signal having a frequency higher than said second frequency of said reference signal; said DSM having a DSM input for receiving a DSM control signal.

35. Synthesizer of claim 34 wherein said feedback portion has a fifth input for receiving a division by integer M control signal (MDIVs); said feedback portion has a sixth input for receiving a division by integer K control signal (KDJVs); said output signal has a plurality of phase-shifted signals; said DSM has a seventh input for receiving a high resolution DSM control signal (FDIVs).

36. Synthesizer of claim 35 wherein said plurality of phase-shifted signals has N.sub.p phasess; said signal FDIVs has a value of Fdiv; said signal MDI Vs has a value of Mdiv, said control signal KDIVs has a value of Kdiv; said real number is determined according to the following equation:

$$(Mdiv)\left(1 + \frac{Fdiv}{N_p * Kdiv}\right)$$

37. Device of claim 34 wherein said feedback portion further comprises a phase rotator having a first input for receiving said first output, phase shifted and at a first frequency; said phase rotator operable to generate a rotated signal, to become said feedback signal, from said first input by a plurality of rotations between phases of said phase-shifted first input.

38. Device of claim 37 wherein said feedback portion further comprises a glitch suppressor having a first input for receiving a suppressor signal generated from first outputs; said glitch suppressor having a second input for receiving said rotated signal; said glitch suppressor having a first output for delivering an output signal to become said feedback signal said glitch suppressor operable to generate said output signal based on an inhibition of reverse transitions for a period around a transition of said rotated signal.

39. Device of claim 38 wherein said transition of said rotated signal is a one-to-zero transition and said corresponding reverse transition is a zero-to-one transition or said transition of said rotated signal is a zero-to-one transition and said corresponding reverse transition is a one-to-zero transition.

40. Device of claim 38 wherein said period is about 90° before and after said transition.

41. Device of claim 38 wherein said suppressor signal is a quadrature clock signal.

42. Device of claim 38, wherein said second frequency for said first output of said phase rotator is smaller than said first frequency for said first input of said phase rotator.

43. Device of claim 42 wherein said phase rotator is operable as part of a feedback portion of a frequency synthesizer having a frequency synthesizer output for delivering said fractional divider input and a feedback input for receiving said rotated signal.

44. Device of claim 43 wherein the DSM controls said plurality of rotations.

45. Device of claim 43 wherein said frequency synthesizer has a synthesizer input for receiving a reference clock; said DSM having a clock input for receiving a clock signal oscillating at a higher frequency than said reference clock.

46. Device of claim 45 wherein said fractional divider input has more than four phases.

47. Device of claim 38 wherein said glitch suppressor further comprises a de-glitcher that comprises:
- a first complement generator having a first complement input for receiving said rotated signal at a first phase; said first complement generator having a first complement output for delivering a complemented rotated signal that is a complement of said rotated signal;
- a second complement generator having a second complement input for receiving a suppressor signal substantially identical to, and phase delayed by a delay period from, said rotated signal by a delay circuit; said second complement generator having a second complement output for delivering a complemented suppressor signal that is a complement of said suppressor signal;
- a first gate having a first input for receiving said rotated signal; said first gate having a second input connected to said second complement output for receiving said complemented suppressor signal; said first gate having a first output for delivering a reset signal;
- a second gate having a third input for receiving said suppressor signal; said second gate having a fourth input connected to said first complement output for receiving said complemented rotated signal; said second gate having a second output for delivering a set signal; and
- an RS Latch having a set input connected to said second output for receiving said set signal; said RS Latch having a reset input connected to said first output for receiving said reset signal; said RS Latch having an RS Latch output for delivering a substantially glitch free signal; said RS Latch operable to inhibit propagation of reverse transitions in said rotated signal for said delay period before and after a transition of said rotated signal.

48. Device of claim 47 wherein said RS Latch is implemented using cross-coupled combination of NOR gates and said first and second gates are AND gates.

49. Device of claim 47 wherein said RS Latch is implemented using cross-coupled combination of NAND gates and said first and second gates are OR gates.

50. Device of claim 47 wherein said suppressor signal is phased delayed from said glitched signal by about 90°.

51. Device of claim 47, wherein said glitched signal is generated by a first phase rotator fractional divider having a first control input for receiving a first control signal.

52. Device of claim 51 wherein said suppressor signal is generated based on said rotated signal using a second phase rotator fractional divider having a second control input for receiving a second control signal that is generated by decoding said control signal.

53. A method for reducing jitter in an output clock signal of a loop based fractional synthesizer having a reference clock input, a forward portion, a phase rotator frequency divider (PRFD), a delta-sigma modulator, an integer divider, and an oscillating signal generated by said forward portion comprising the steps of:
- generating a quantized signal by over-sampling said delta-sigma modulator at frequencies derived from an output of said PRFD, said frequencies being higher than said reference clock such that quantization noise contained in said quantized signal is a high frequency quantization noise;
- receiving said quantized signal at said PRFD; frequency dividing said oscillating signal by said PRFD according to said quantized signal; and
- filtering said high frequency quantization noise by said forward portion.

54. The method of claim 53 wherein the frequency dividing step further comprises the step of de-glitching the frequency divided signal at the PRFD.

55. A method for synthesizing a frequency comprising the steps of:
- generating an oscillating signal based on a phase or a frequency or a phase and frequency difference between a reference clock signal and a feedback signal;
- generating a fractionally divided signal using a fractional divider;
- generating a quantized bit-stream signal based on a high resolution input signal and a second clock signal derived from an output of said fractional divider the frequency of said second clock signal being higher than a frequency of the reference clock signal;
- generating a said fractionally divided signal based on said oscillating signal according to said quantized bit-stream signal; said fractionally divided signal having a frequency that is a fraction of said oscillating signal's frequency; and
- generating said feedback signal by frequency dividing said fractionally divided signal by an integer value.

56. The method of claim 55 wherein the step of generating a fractionally divided signal further comprises the step of de-glitching the frequency divided signal.

* * * * *